US009946551B2

(12) United States Patent
Sato et al.

(10) Patent No.: US 9,946,551 B2
(45) Date of Patent: Apr. 17, 2018

(54) SYSTEM AND METHOD THAT GENERATE RECONFIGURATION INFORMATION

(71) Applicant: AXION RESEARCH INC., Tsukuba, Ibaraki (JP)

(72) Inventors: Tomoyoshi Sato, Tsukuba (JP); Prakash Sreedhar Murthy, Tsukuba (JP); Takeshi Sato, Tsukuba (JP)

(73) Assignee: AXION RESEARCH INC., Tsukuba, Ibaraki (JP)

( * ) Notice: Subject to any disclaimer, the term of this patent is extended or adjusted under 35 U.S.C. 154(b) by 75 days.

(21) Appl. No.: 14/771,925

(22) PCT Filed: Mar. 3, 2014

(86) PCT No.: PCT/JP2014/001130
§ 371 (c)(1),
(2) Date: Dec. 4, 2015

(87) PCT Pub. No.: WO2014/132670
PCT Pub. Date: Sep. 4, 2014

(65) Prior Publication Data
US 2016/0210156 A1    Jul. 21, 2016

(30) Foreign Application Priority Data

Mar. 1, 2013 (JP) .................. 2013-041240
Mar. 1, 2013 (JP) .................. 2013-041269

(51) Int. Cl.
*G06F 9/00* (2006.01)
*G06F 1/24* (2006.01)
(Continued)

(52) U.S. Cl.
CPC .......... *G06F 9/4401* (2013.01); *G06F 13/404* (2013.01); *G06F 13/4282* (2013.01); *H03K 19/17748* (2013.01)

(58) Field of Classification Search
CPC .. G06F 9/4401; G06F 13/404; G06F 13/4282; G06F 15/7867; G06F 17/5054;
(Continued)

(56) References Cited

U.S. PATENT DOCUMENTS 6,336,208 B1 * 1/2002 Mohan ................ G06F 17/5054
326/37
8,201,125 B1 * 6/2012 Jang ...................... G06F 17/505
716/104

(Continued)

FOREIGN PATENT DOCUMENTS

WO    WO 2005/022380 A1    3/2005
WO    WO 2011/162116 A1    12/2011

OTHER PUBLICATIONS

Notification of Transmittal of Translation of the International Preliminary Report on Patentability (Forms PCT/IB/338 and PCT/IB/373) and the Written Opinion of the International Searching Authority (Form PCT/ISA/237) issued on Sep. 11, 2015 by International Bureau of WIPO, in corresponding International Application No. PCT/JP2014/001130. (6 pages).

*Primary Examiner* — Nitin Patel
(74) *Attorney, Agent, or Firm* — Buchanan Ingersoll & Rooney PC

(57) ABSTRACT

A netlist converter, which generates configuration information for reconfiguring a reconfigurable logic operation unit, includes: a mapping unit that enumerates k-feasible cuts where the number of nodes after cutting is an integer k or fewer, out of all cuts for each node included in a netlist generated based on a specification to be processed in the logic operation unit; and a generating unit that generates configuration information including element reconfiguration information that reconfigures elements by selecting cuts assigned to the elements out of the enumerated k-feasible cuts and channel reconfiguration information for reconfig- (Continued)

uring the data transfer channels to realize the netlist by connecting the reconfigured elements.

7 Claims, 29 Drawing Sheets

(51) Int. Cl.
  *G06F 9/44* (2018.01)
  *H03K 19/177* (2006.01)
  *G06F 13/40* (2006.01)
  *G06F 13/42* (2006.01)

(58) Field of Classification Search
  CPC ............. G06F 17/5045; G06F 17/5081; G06F 17/5068; H03K 19/17748; H03K 19/17736; H03K 19/17728; H03K 19/17752; H03K 19/17756
  USPC .......................................... 713/100; 716/116
  See application file for complete search history.

(56) References Cited

U.S. PATENT DOCUMENTS

| | | | |
|---|---|---|---|
| 2005/0039157 A1* | 2/2005 | Sharma | G06F 17/5054 716/116 |
| 2008/0122482 A1* | 5/2008 | Sato | G06F 15/7867 326/38 |
| 2013/0100750 A1 | 4/2013 | Ishiguro et al. | |

* cited by examiner

Fig. 6
(a)
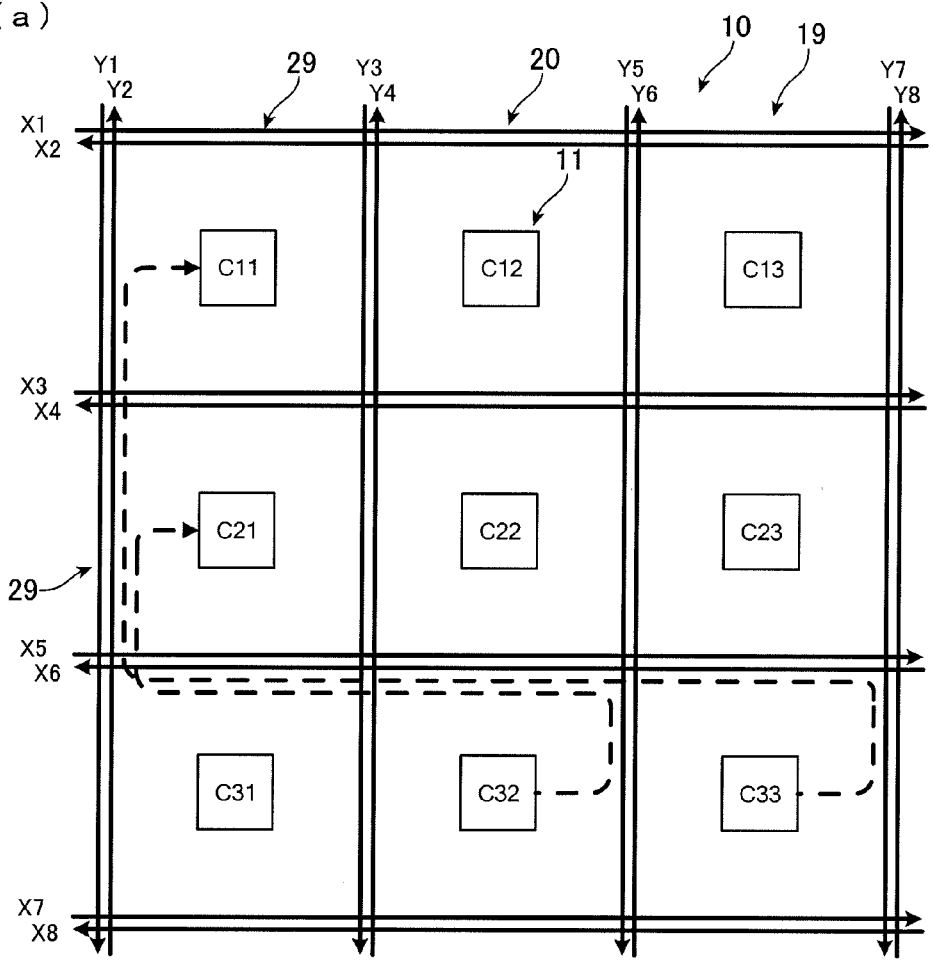
(b)
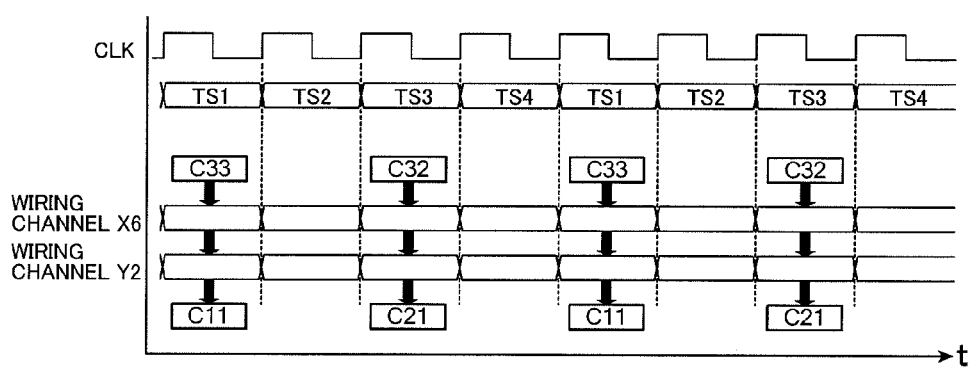

(a)

(b)

| PORT NAME | range | I/O | POLARITY | ATTRIBUTES | COMMENTS |
|---|---|---|---|---|---|
| CLK | 1 | I | - | | CLOCK |
| RST_X | 1 | I | N | | ASYNCHRONOUS RESET |
| A0 | 3:0 | I | - | | INPUT DATA 0 |
| A1 | 3:0 | I | - | | INPUT DATA 1 |
| A2 | 3:0 | I | - | | INPUT DATA 2 |
| A3 | 3:0 | I | - | | INPUT DATA 3 |
| X0 | 3:0 | O | - | | OUTPUT DATA 0 |
| X1 | 3:0 | O | - | | OUTPUT DATA 1 |
| X2 | 3:0 | O | - | | OUTPUT DATA 2 |
| X3 | 3:0 | O | - | | OUTPUT DATA 3 |
| CRA | 3:0 | I | - | | CONFIGURATION DESIGNATION ADDRESS |
| CWA | 3:0 | I | - | | CONFIGURATION SETTING ADDRESS |
| CWE | 16:0 | I | - | | CONFIGURATION WRITE ENABLE |
| CWD | 18:0 | I | - | | CONFIGURATION SETTING INFORMATION |

(a)

(b)

| PORT NAME | range | I/O | POLARITY | ATTRIBUTES | COMMENTS |
|---|---|---|---|---|---|
| CLK | 1 | I | - | | CLOCK |
| RST_X | 1 | I | N | | ASYNCHRONOUS RESET |
| A0 | 3:0 | I | - | | INPUT DATA 0 |
| A1 | 3:0 | I | - | | INPUT DATA 1 |
| A2 | 3:0 | I | - | | INPUT DATA 2 |
| A3 | 3:0 | I | - | | INPUT DATA 3 |
| X0 | 3:0 | O | - | | OUTPUT DATA 0 |
| X1 | 3:0 | O | - | | OUTPUT DATA 1 |

Fig. 9
(a)
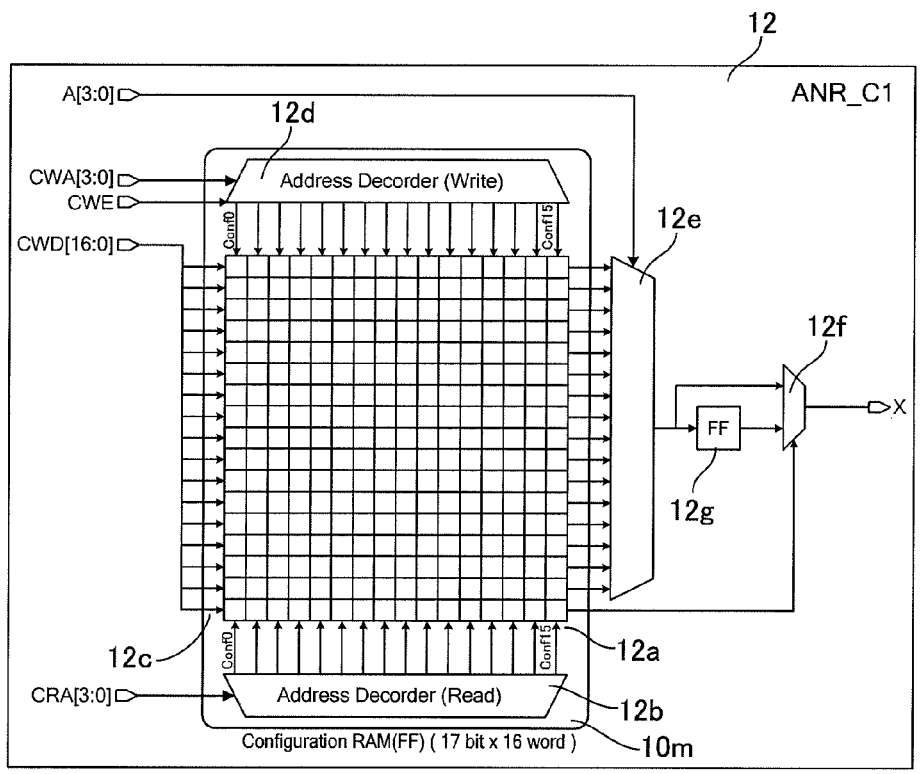
(b)
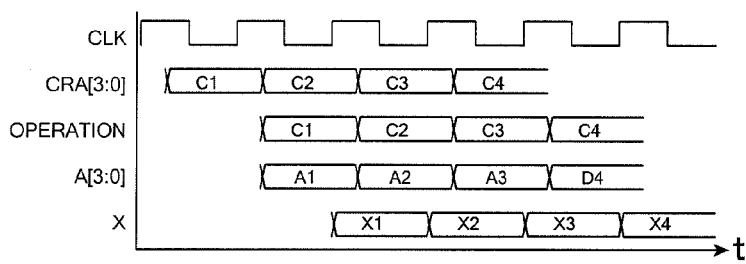
(c)
| PORT NAME | range | I/O | POLARITY | ATTRIBUTES | COMMENTS |
|---|---|---|---|---|---|
| CLK | 1 | I | – | | CLOCK |
| RST_X | 1 | I | N | | ASYNCHRONOUS RESET |
| A | 3:0 | I | – | | INPUT DATA |
| X | 1 | O | – | | OUTPUT DATA |
| CRA | 3:0 | I | – | | CONFIGURATION DESIGNATION ADDRESS |
| CWA | 3:0 | I | – | | CONFIGURATION SETTING ADDRESS |
| CWE | 1 | I | – | | CONFIGURATION WRITE ENABLE |
| CWD | 16:0 | I | – | | CONFIGURATION SETTING INFORMATION |

Fig. 13
(a)
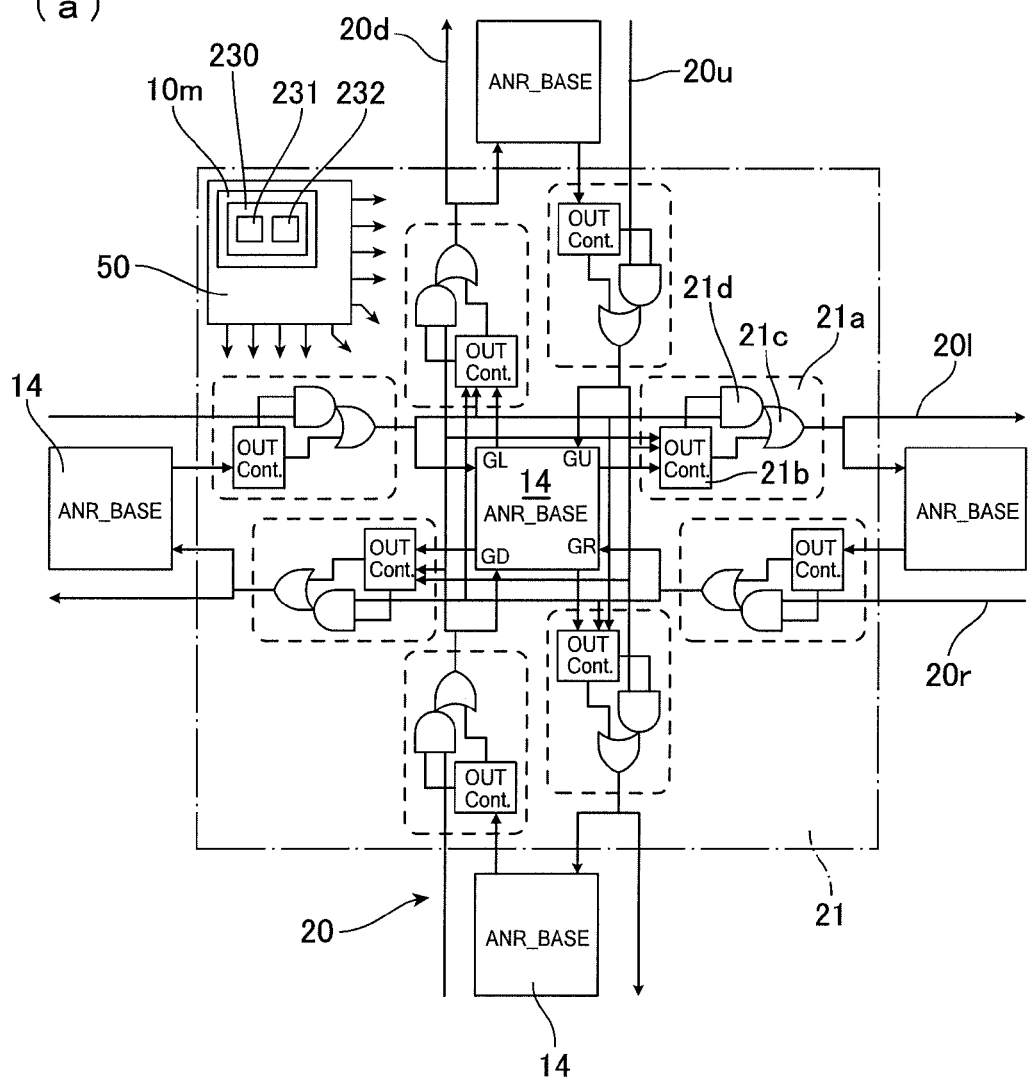
(b)
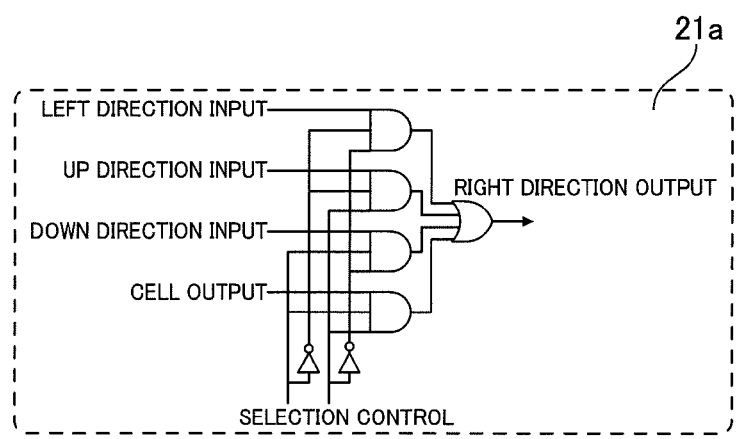

Fig. 19
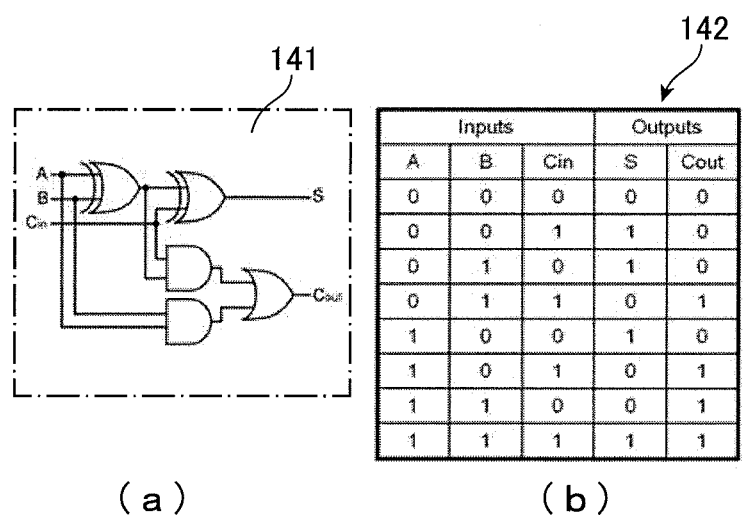
(a)  (b)
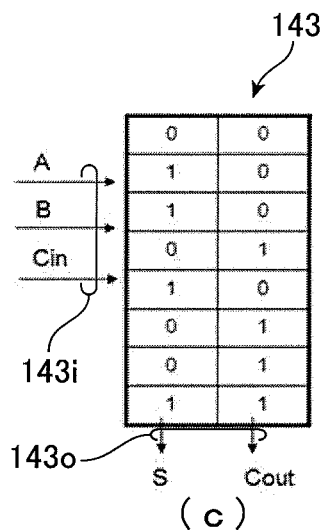
(c)

Fig. 20
(a)
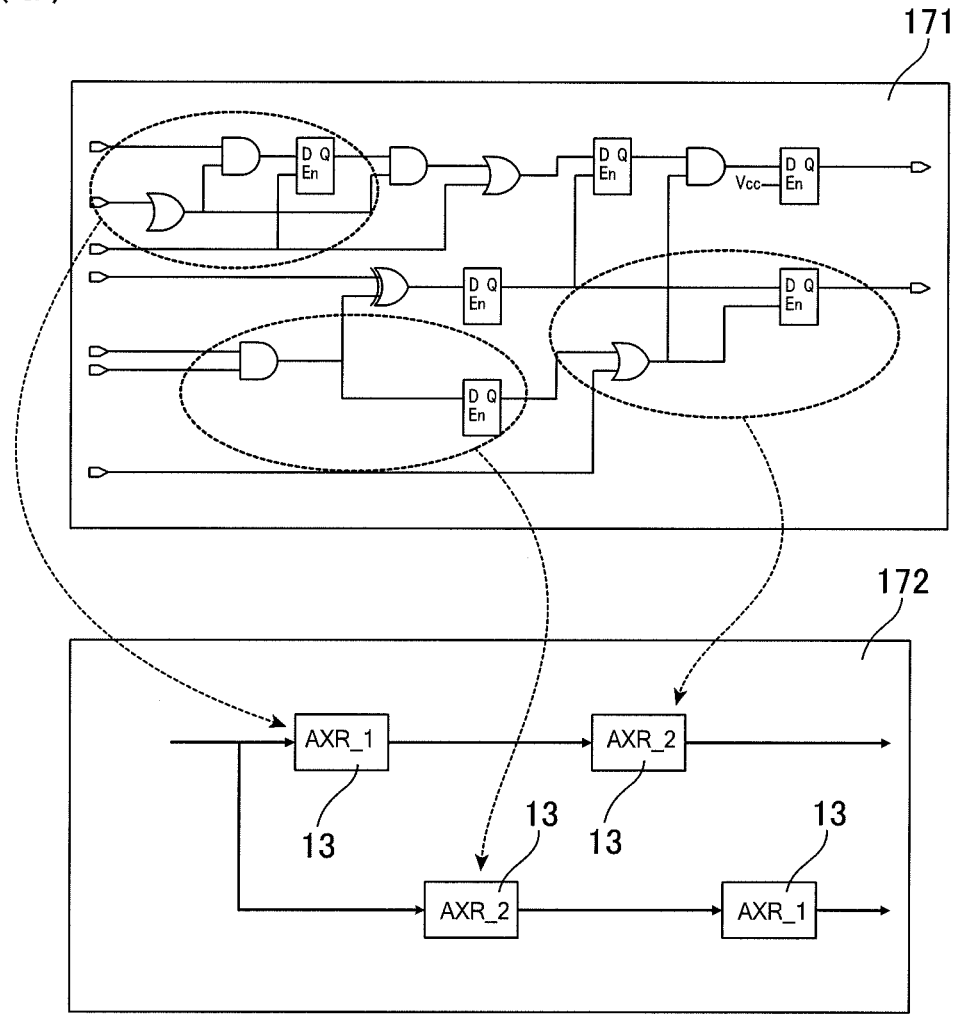
(b)
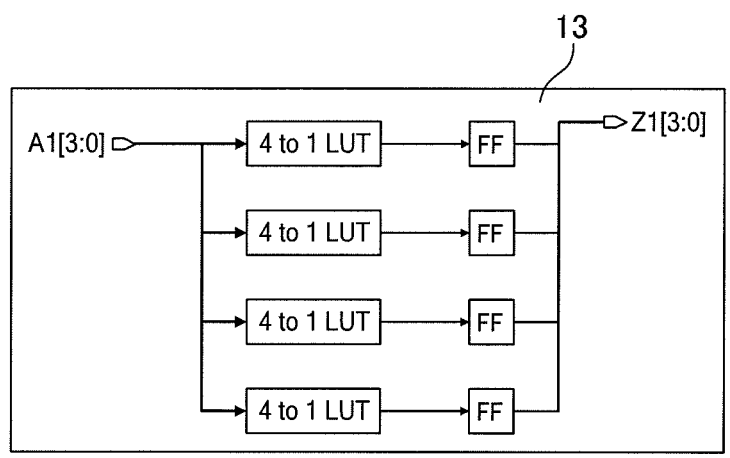

Fig. 26

```
module encoder(
binary_out , //  3 bit binary Output
encoder_in , //  8-bit Input
enable      // Enable for the encoder
);
output [2:0] binary_out ;
input  enable ;
input [7:0] encoder_in ;

reg [2:0] binary_out ;

always @ (enable or encoder_in)
begin
  binary_out = 0;
  if (enable) begin
    case (encoder_in)
      8'h02 : binary_out = 1;
      8'h04 : binary_out = 2;
      8'h08 : binary_out = 3;
      8'h10 : binary_out = 4;
      8'h20 : binary_out = 5;
      8'h40 : binary_out = 6;
      8'h80 : binary_out = 7;
    endcase
  end
end
endmodule
```
— 291

Fig. 27

```
module encoder(binary_out, encoder_in, enable);
  output [2:0]binary_out;
  input [7:0]encoder_in;
  input enable;

wire n_0_0,n_0_1,n_0_2,n_0_3,n_0_4,n_0_5,n_0_6,n_0_7,n_0_8;
wire ,n_0_14,n_0_15,n_0_16,n_0_17,n_0_18,n_0_19,n_0_20;

CQOR2X1 i_0
(.Y(n_0_0), .A(encoder_in[0]), .B(encoder_in[2]));
  CQOR2X1 i_1
(.Y(n_0_1), .A(encoder_in[6]), .B(encoder_in[4]));
  CQNOR2X1 i_2 (.Y(n_0_2), .A(n_0_0), .B(n_0_1));
  CQEOX1 i_3
(.Y(n_0_3), .A(encoder_in[7]), .B(encoder_in[5]));
  CQNOR2X1 i_4
(.Y(n_0_4), .A(encoder_in[7]), .B(encoder_in[5]));
  CQIVX1 i_5 (.A(n_0_4), .Y(n_0_5));
  CQMX2X1 i_6
(.A(n_0_4), .B(n_0_3), .S(encoder_in[3]), .Y(n_0_6));
  CQNOR2X1 i_7 (.Y(n_0_7), .A(n_0_5), .B(encoder_in[3]));
  CQMX2X1 i_8
(.A(n_0_7), .B(n_0_6), .S(encoder_in[1]), .Y(n_0_8));
  CQAN2X1 i_9 (.Y(n_0_9), .A(n_0_8), .B(n_0_2));
  CQOR2X1 i_10
(.Y(n_0_10), .A(encoder_in[5]), .B(encoder_in[4]));
  CQNOR2X1 i_11 (.Y(n_0_11), .A(n_0_16), .B(n_0_10));
  CQMX2X1 i_12
(.A(n_0_20), .B(n_0_19), .S(encoder_in[3]), .Y(n_0_12));
  CQNOR2X1 i_13 (.Y(n_0_13), .A(n_0_21), .B(encoder_in[3]));
  CQMX2X1 i_14
(.A(n_0_13), .B(n_0_12), .S(encoder_in[2]), .Y(n_0_14));
  CQAN2X1 i_15 (.Y(n_0_15), .A(n_0_14), .B(n_0_11));
  CQOR2X1 i_16
(.Y(n_0_16), .A(encoder_in[0]), .B(encoder_in[1]));
  CQOR2X1 i_17
(.Y(n_0_17), .A(encoder_in[2]), .B(encoder_in[3]));
  CQNOR2X1 i_18 (.Y(n_0_18), .A(n_0_16), .B(n_0_17));
  CQEOX1 i_19
(.Y(n_0_19), .A(encoder_in[7]), .B(encoder_in[6]));
  CQNOR2X1 i_20
(.Y(n_0_20), .A(encoder_in[7]), .B(encoder_in[6]));
  CQIVX1 i_21 (.A(n_0_20), .Y(n_0_21));
  CQMX2X1 i_22
(.A(n_0_20), .B(n_0_19), .S(encoder_in[5]), .Y(n_0_22));
  CQNOR2X1 i_23 (.Y(n_0_23), .A(n_0_21), .B(encoder_in[5]));
  CQMX2X1 i_24
(.A(n_0_23), .B(n_0_22), .S(encoder_in[4]), .Y(n_0_24));
  CQAN2X1 i_25 (.Y(n_0_25), .A(n_0_24), .B(n_0_18));
  CQAN2X1 i_26 (.Y(binary_out[0]), .A(n_0_9), .B(enable));
  CQAN2X1 i_27 (.Y(binary_out[1]), .A(n_0_15), .B(enable));
  CQAN2X1 i_28 (.Y(binary_out[2]), .A(n_0_25), .B(enable));
endmodule
```

```
binary_out[0] = n12 & n11 & ~n14 & ~n15;
 n14 = encoder_in[3] & (~encoder_in[5] ^ encoder_in[7] );
 n15 = (encoder_in[5] | encoder_in[7] ) & (~encoder_in[1] |
encoder_in[3] );
       n16 = ~encoder_in[2] & enable;
       n17 = ~encoder_in[6] & ~encoder_in[0] &
       ~encoder_in[4] ;
binary_out[1] = n22 & n21 & ~n19 & ~n20;
       n19 = encoder_in[3] & (~encoder_in[6] ^ encoder_in[7] );
       n20 = (encoder_in[6] | encoder_in[7] ) & (~encoder_in[2]
       | ~encoder_in[3] );
       n21 = ~encoder_in[0] & ~encoder_in[1] ;
       n22 = enable & ~encoder_in[4] & ~encoder_in[5] ;
binary_out[2] = ~n24 & n21 & ~encoder_in[3] & n16;
       n24 = (~encoder_in[4] | ~encoder_in[5] | (~encoder_in[6]
       ^ encoder_in[7] )) & (encoder_in[5] | encoder_in[6] |
       encoder_in[7] );
```
— 294

Fig. 30

Choose ANR_C1 with most inputs

Select next ANR_C1 -> ANR_C1 which shares most inputs and outputs with cluster

Continue until cluster is full or adding any ANR_C1 will overflow I -> # inputs

Hill Climbing – exceed I limit temporarily to find better minimum

Continue the same for ANR_C1x4 cells to get optimum number of ANR_BASE cells.

```
n16 = ~encoder_in[2] & enable;
n17 = ~encoder_in[6] & ~encoder_in[0] &
~encoder_in[4] ;
n21 = ~encoder_in[0] & ~encoder_in[1] ;
n22 = enable & ~encoder_in[4] & ~encoder_in[5] ;
binary_out[2]  = ~n24 & ~encoder_in[3]  & n16
& n21;
n24 = (~encoder_in[4] | ~encoder_in[5] |
(~encoder_in[6] ^encoder_in[7] )) & (encoder_in[5]
| encoder_in[6] | encoder_in[7] );
binary_out[0]  = n16 & n17 & ~n26;
n26 = (~encoder_in[1] | ~encoder_in[3] |
(~encoder_in[5] ^ encoder_in[7] )) &
(encoder_in[3] | encoder_in[5] | encoder_in[7] );
 binary_out[1]  = n21 & n22 & ~n28;
n28 = (~encoder_in[2] | ~encoder_in[3] |
(~encoder_in[6] ^ encoder_in[7] )) &
(encoder_in[3] |  encoder_in[6]  | encoder_in[7] );
```
— 296

SYSTEM AND METHOD THAT GENERATE RECONFIGURATION INFORMATION

TECHNICAL FIELD

The present invention relates to a system and method that generate information that reconfigures a reconfigurable logic operation unit.

BACKGROUND ART

PCT Publication WO2005/022380 discloses a data processing system that uses architecture code including: object circuit information for dynamically mapping an object circuit, which forms at least part of a circuit for executing an application, onto part of a reconfigurable logic circuit; interface circuit information for mapping an interface circuit, which connects to the object circuit, onto the logic circuit; and environmental conditions to be realized in the interface circuit.

DISCLOSURE OF THE INVENTION

There is demand for a system and method that generate configuration information to be implemented in an system in which circuits can be reconfigured.

One aspect of the present invention is a system that generates configuration information that reconfigures a reconfigurable logic operation unit. The logic operation unit (logical operation unit) includes: elements that are reconfigurable elements and each include an integer k number of inputs; and reconfigurable data transfer channels that are channels for transferring data used in operations between a plurality of the elements. The system includes: a unit that enumerates k-feasible cuts, where the number of nodes after cutting is no greater than the integer k, out of all cuts of respective nodes included in a netlist generated based on a specification to be processed in the logic operation unit; and a generation unit that generates the configuration information that includes element reconfiguration information that reconfigures the elements by selecting cuts assigned to the elements out of the enumerated k-feasible cuts and channel reconfiguration information that reconfigures the data transfer channels so as to realize the netlist by connecting the reconfigured elements.

It is desirable for the generation unit to include a unit that generates the configuration information that includes the element reconfiguration information and the channel reconfiguration information divided into units for reconfiguring the logic operation unit in a time division. It is also desirable for the unit that enumerates to include a unit that detects duplication in the enumerated k-feasibility cuts.

Another aspect of the present invention is a method of generating configuration information for reconfiguring a reconfigurable logic operation unit using a computer including a CPU and a memory. The method includes the following steps.
1. Enumerating k-feasible cuts, where the number of nodes after cutting is no greater than the integer k, out of all cuts of respective nodes included in a netlist generated based on a specification to be processed in the logic operation unit and
2. Generating the configuration information that includes element reconfiguration information that reconfigures the elements by selecting cuts assigned to the elements out of the enumerated k-feasible cuts and channel reconfiguration information that reconfigures the data transfer channels so as to realize the netlist by connecting the reconfigured elements.

It is desirable for the step of generating to include a unit that generates the configuration information that includes the element reconfiguration information and the channel reconfiguration information divided into units for reconfiguring the logic operation unit according to time division. It is also desirable for the method to include detecting duplication in the enumerated k-feasibility cuts. This method can be provided as a program (program product) that generates configuration information for reconfiguring a reconfigurable logic operation unit using a computer including a CPU and a memory. The program includes instructions that execute the steps described above.

BRIEF DESCRIPTION OF DRAWINGS

FIG. 6 shows how the wiring channels of an ANR are used according to time division.
FIG. 9 is a diagram of an ANR-C1 module.
FIG. 13 is a diagram of a different wiring channel cell.
FIG. 19 is an example where a logic circuit is implemented using an LUT.
FIG. 20 is an example where a netlist is implemented in an ANR.
FIG. 26 is a diagram showing an example of RTL.
FIG. 27 is a diagram showing an example of a netlist.
FIG. 29 is a diagram showing an example of mapping information of nodes.
FIG. 30 is a diagram showing a packing algorithm.

FIG. 31 is a diagram showing an example of mapping information that has been optimized.

DETAIL DESCRIPTION

Figure 1:
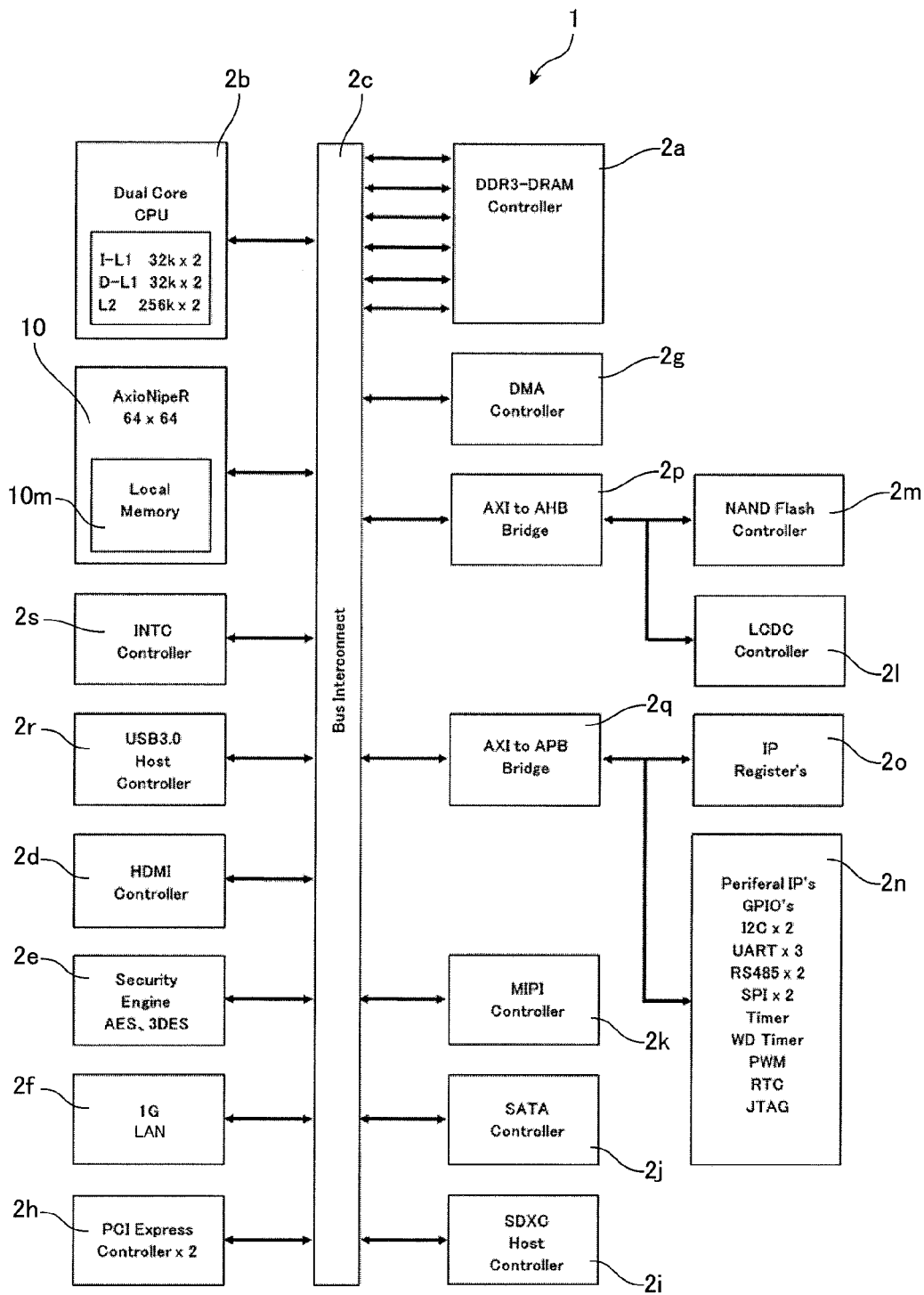
FIG. 1 is a block diagram of a data processing system.

FIG. 1 shows an overview of a data processing system (processing apparatus, processing device) 1 including a reconfigurable circuit (or "DRP subsystem") 10. The system 1 is a type that boots the OS from flash memory and includes DDR3-DRAM 2a as main memory. The system 1 can be mass produced as a POP (Package On Package) for example, or by another method. The system 1 includes a bus (AXI bus) 2c that uses an internal bus architecture such as AMBA 3.0, a CPU (CPU core) 2b, and the DRP subsystem 10 that is connected to the CPU 2b by the bus 2c. The DRP subsystem 10 includes a configuration memory 10m that stores information ("configuration information") used for reconfiguring.

In the system 1, a system (AxioNipeR) that has been newly developed by the applicant is used as the DRP subsystem 10. The DRP subsystem 10 includes a plurality of logic elements (or simply "elements") that have an appropriate number of inputs and outputs and perform logic operations (logical operations) that can be changed (reconfigured) on a cycle-by-cycle basis (in cycle units), and the DRP 10 may be any device that can be partly reconfigured on a cycle by cycle basis. The DRP subsystem (AxioNipeR) 10 in the present embodiment is equipped with a matrix (array) in which 64 elements are laid out in both the vertical and horizontal directions.

The system 1 further includes a USB controller 2r, a high-definition multimedia interface controller 2d, a security engine controller 2e, a LAN controller 2f, a DMA controller 2g, a PCI controller 2h, an SDXC controller 2i, a SATA controller 2j, an MIPI interface controller 2k, an LCDC controller 2l, a NAND flash controller 2m, a peripheral function 2n, a peripheral function register 2o, and an INTC controller 2s, with such components being connected via the internal bus 2c and bridges 2p, 2q.

The DRP subsystem (AxioNipeR, hereinafter simply "ANR") 10 is a Dynamic Reconfigurable Processor, and includes an array with a fine grain configuration. By equipping the system 1 with the ANR 10, it is possible, in fields such as chemical substance analysis where there is demand for parallel data processing on a comparatively large scale, to carry out parallel data processing that is grouped into each stage of an analysis process and to also use resources for other processing in parallel or according to time division (in a time division). As one example, a method where a hardware area for the maximum execution performance is provided as the ANR 10 and other processing is carried out in a given order as parallel processing with such area as a maximum is extremely economical. It is especially effective to successively determine and execute such parallel data processing.

An effect is also achieved whereby the hardware implementation itself can be changed by software patches and upgrades in response to future requests for improvement in system demands and/or demands for increased performance. In reality, there is great need for LSIs that are capable with future changes, which greatly reduce the risk involved with system implementation and effectively shorten the time required for hardware development. A platform strategy where different processing and/or applications are executed by the same computational device has the important advantages of shortening development and flexibly coping with customer demands.

Although a typical FPGA is known as a reconfigurable device that has a fine grain configuration, the ANR 10 overcomes the problem that an FPGA has poor efficiency and a low operation frequency and also solves the problem that reconfigurable devices with a fine grain configuration have low flexibility.

Figure 2:
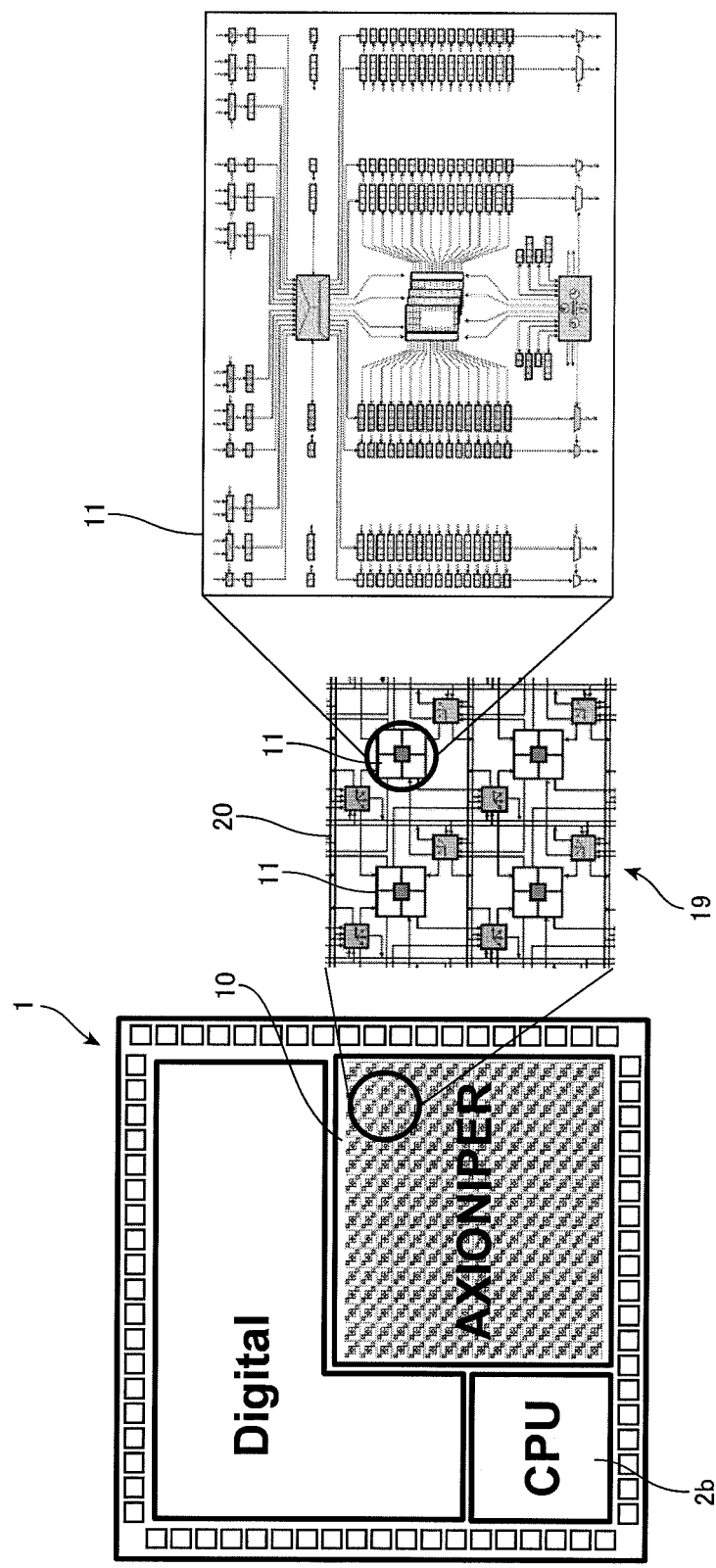
FIG. 2 shows progressive enlargements of the overall configuration of a DRP subsystem (ANR).

FIG. 2 shows an overview of the ANR 10. FIG. 2 shows an enlargement of a region (tile) 19, which is part of the ANR 10 taken from the system 1 and includes a plurality of cells 11, and also shows an enlargement of the overall configuration of a cell 11. One cell 11 has a plurality (a maximum of 8 or 16) of units of reconfiguration information (configuration information) and generates a circuit by dynamically switching between such information in one clock. The respective cells 11 are capable of operating as other logic operation units (logic operation circuits) one clock later, for example, after 1 ns, and for that reason a single cell 11 appears to function as a plurality of multiplexed circuit modules.

The ANR 10 has a symmetric network topology, with it being possible to transfer data in the up-down and left-right directions using connection channels between adjacent cells and global connection channels 20 between distant cells. Although an example where the cells 11 are laid out in two dimensions is described below, the cells 11 may be laid out in three dimensions, and the connection channels 20 may also have a three-dimensional structure. In addition, the connection channels 20 may be something that is fixed to a circuit board or the like in the manner of wiring or may be a space in which signals propagate, such as with optical communication (for example, visible light communication), and additionally, the connection channels 20 may be something that does not have fixed paths and connects the cells 11 while being capable of dynamic reconfiguration.

The global connection channels 20 include a system that transfers signals (data) that have been multiplexed in a time division (time-division multiplexing), which increases the utilization rate of the channels 20 and avoids incurring a wiring cost. In the same way as circuit generation, scheduling of the channel connections is carried out via prescheduling according to dataflow analysis, which will be described in detail later. The data transfer method may be a packet data transfer method using attached labels or may be a data transfer method with a simple structure achieved by indicating the data creation and reception timing. It is desirable for the global connection channels 20 to provide enough bandwidth for data transfer by circuits that have been generated by dynamic events, which makes it possible to generate circuits in the ANR 10 according to dynamic events.

The respective cells (that corresponds each element, respective logic operation elements) 11 in the ANR 10 are multiplexed in a time division and have a configuration that can be configured on a single clock (1 ns) by single clock basis (in single clock (1 ns) units). By designating the necessary configuration, it is possible to achieve an arbitrary circuit configuration by referring to the configuration memory 10m that has been set in advance.

Figure 3:
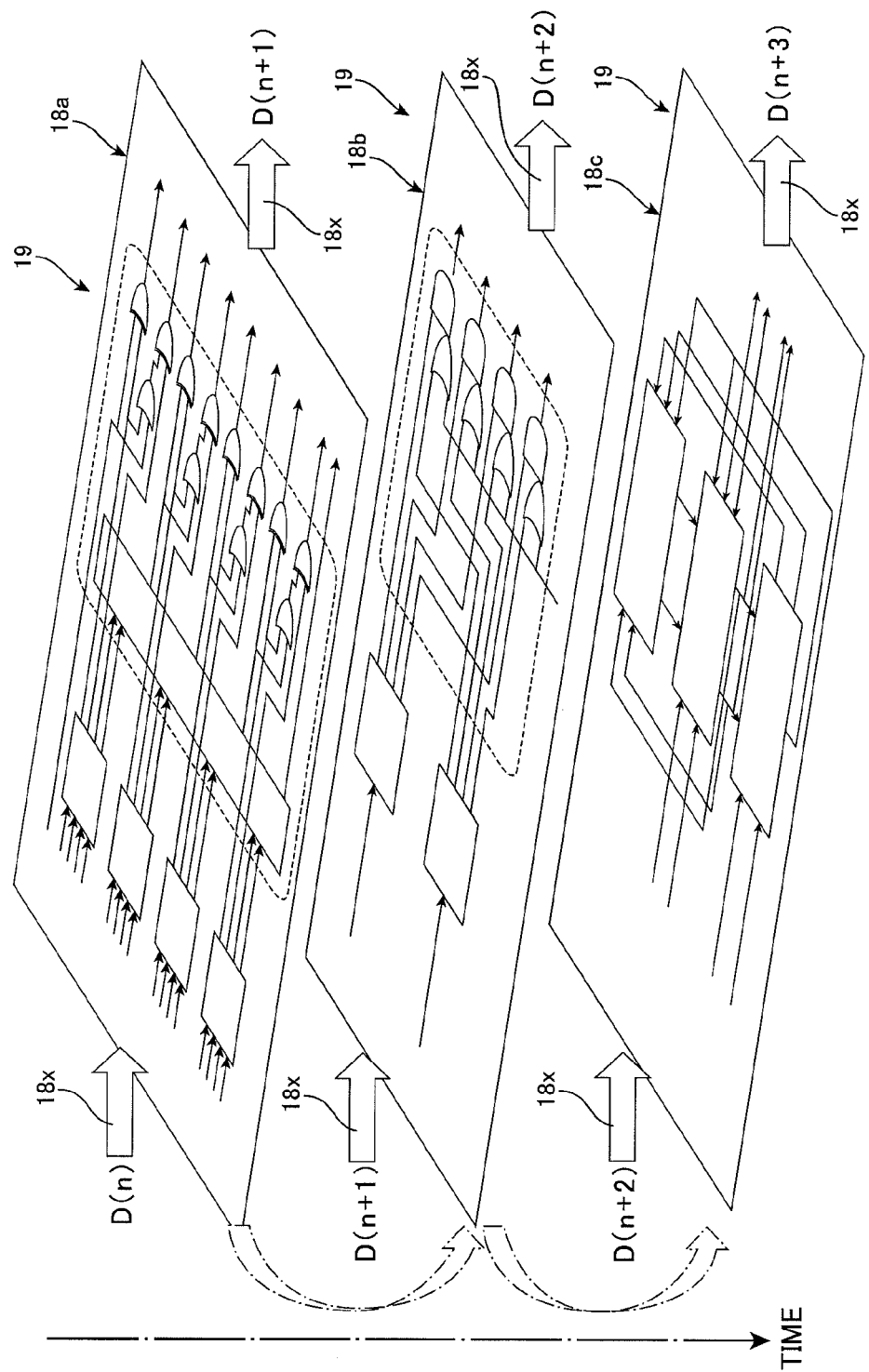
FIG. 3 shows how a circuit is reconfigured on a cycle by cycle basis.

FIG. 3 shows an example where a circuit is reconfigured by an actual change in configuration. Such change in configuration can be carried out in units of the cells 11 (cell by cell basis) or in units that include a plurality of cells 11. Depending on the function module (configuration module) to be reconfigured, it is possible to treat a plurality of cells as a single module unit (or "tile") 19.

In FIG. 3, the tile 19 functions as an adder circuit 18a in the first clock cycle (n clock), functions as a decoder circuit 18*b* in the second clock cycle (n+1 clock), and functions as a shifter circuit 18*c* in the third clock cycle (n+2 clock). As one example, by providing a register that stores an operation result inside or outside the tile 19, it becomes possible for input/output data 18*x* that has been calculated in each clock cycle to propagate (i.e., be inputted and outputted) beyond the functions that are being reconfigured, which makes it possible for a plurality of logic functions to be seamlessly multiplexed onto what is physically the same tile 19. Accordingly, it is possible to reduce the circuit scale that is needed to carry out a large number of and/or complex logic operations. It is of course also possible for a plurality of logic functions to be implemented in what is physically not the same tile 19 either in a time division or in parallel, and also possible to reconfigure by changing tiles 19 that physically overlap in part and/or changing the size of the tiles 19 used for the implementation.

Figure 4:
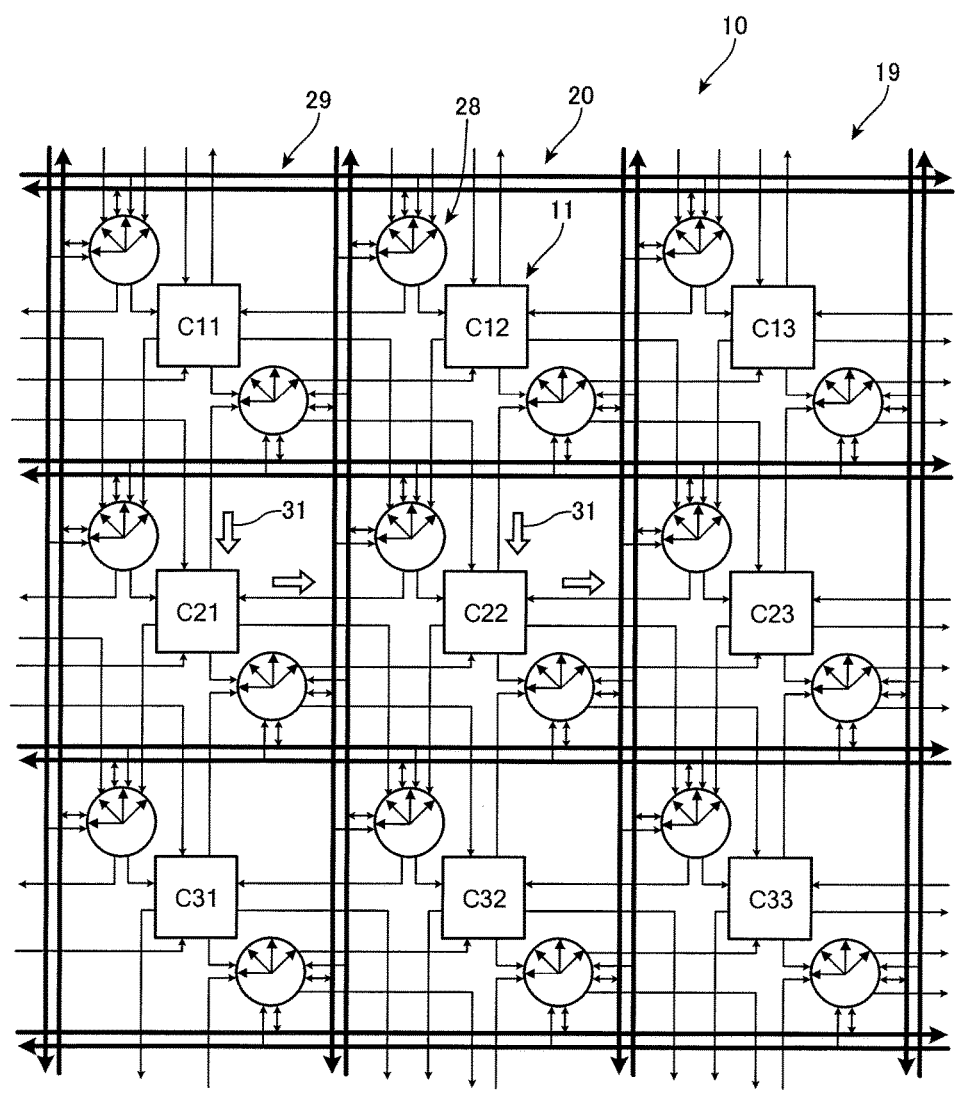
FIG. 4 shows the flow of data in an ANR.
Figure 5:
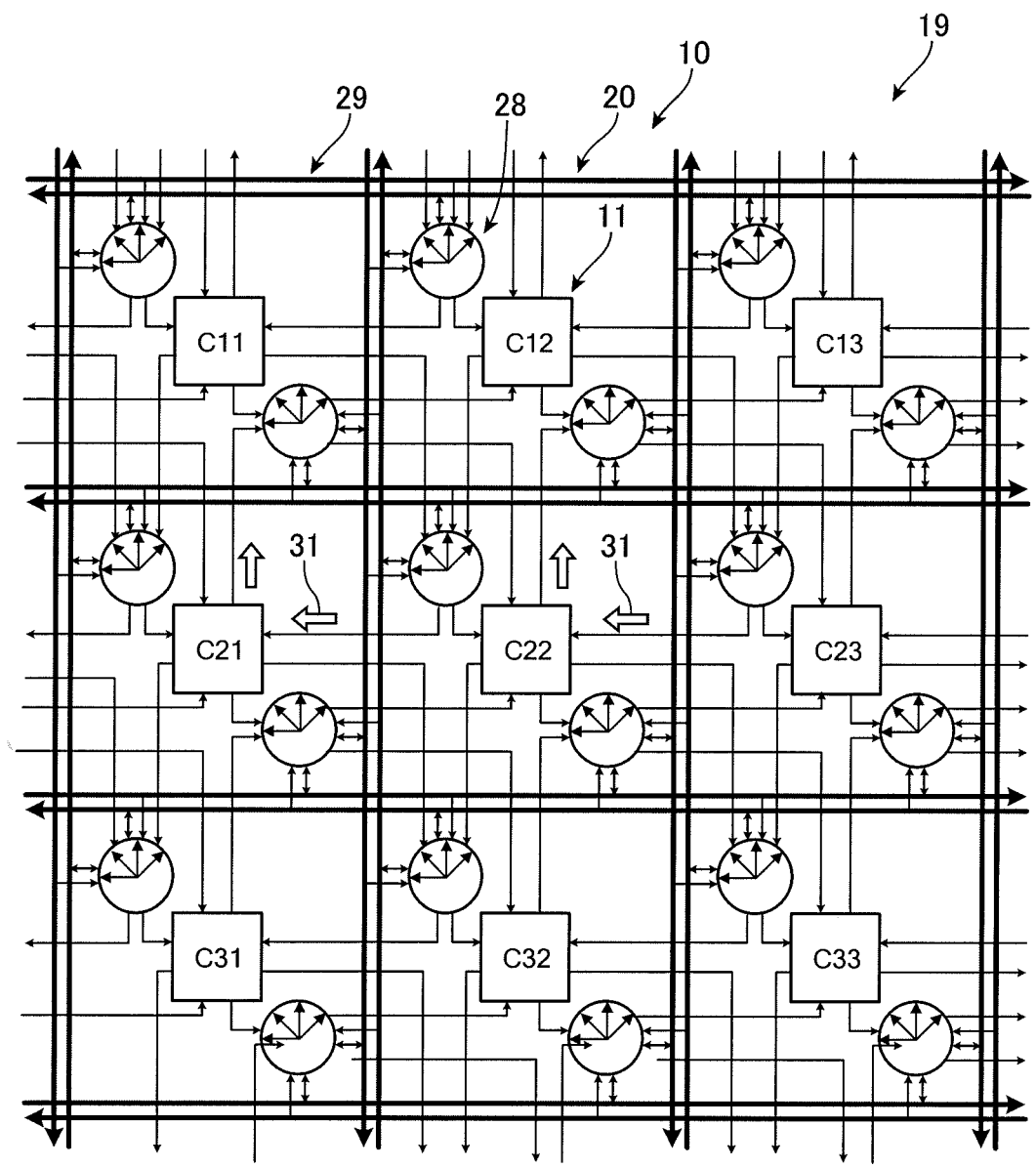
FIG. 5 shows a different flow of data.

As shown in FIGS. 4, 5, and 6, the flow of the data 31 is also multiplexed in the ANR 10. The direction of the data inputted into and outputted from a given cell 11 can be controlled by an inter-connection channel 28 that connects between cells 11 and connects the cell 11 to the global connection channels 20. One example of the inter-connection channel 28 is a crossbar switch and by using an internal crossbar switch, it is possible to control output and input to two components (cells 11, global connection channels 20) simultaneously. The global connection channels 20 include wiring channels 29 that carry out data transfers that pass over the cells 11. The wiring channels 29 include two channels in the vertical direction and two channels in the horizontal direction. By using time slots that are decided between respective cells 11 in the same way as the configuration information of the cells 11, the global connection channels 20 are capable of carrying out data transfers between a plurality of cells 11 by time multiplexing on one channel.

The tile 19 shown in FIG. 4 is configured so that the data 31 flows in the downward direction and rightward direction between the cells 11. The tile 19 shown in FIG. 5 is configured so that the data 31 flows in the leftward direction and upward direction between the cells 11.

FIG. 6 shows, by way of a timing chart, how multiplexing is carried out on a wiring channel X6 in the horizontal direction and a wiring channel Y2 in the vertical direction. FIG. 6(*a*) shows how a process (a logic operation) where data is exchanged between the cell C33 and the cell C11 and a process where data is exchanged between the cell C32 and the cell C21 are configured in physically the same tile 19 in a time division. FIG. 6(*b*) is a timing chart showing how the wiring channels X6 and Y2 are occupied, and shows that the same wiring channels X6 and Y2 are occupied in a time division using slots TS1 in which a process (a logic operation) where data is exchanged between the cell C33 and the cell C11 is configured and slots TS3 in which a process where data is exchanged between the cell C32 and the cell C21 is configured.

The ANR 10 that is a logic operation unit that includes cells (elements, function cells) 11, where logic operations (function operations) are defined, and wiring channel cells 20, which carry out data transfer control between the cells 11. Logic operations to be implemented in a tile 19 that includes the plurality of the cells 11 and/or in the ANR 10 that is a matrix of cells 11, is usually recognized as a circuitry. However, with the ANR 10, since it is possible to change the configuration on a clock-by-clock basis, it is not necessary to make a meaningful circuitry, or a circuitry whose logic operations can be clearly understood or comprehended, and it is sufficient to configure the tile 19 or the ANR 10 so that a predetermined logic operation result is obtained after a predetermined number of clock cycles have elapsed (i.e., with a predetermined latency). The respective cells 11 are symmetrical and it is possible to configure the ANR 10 by connecting a plurality of cells 11 in the form of tiles (a matrix) in units of N cells by M cells.

The circuit operation of the individual cells 11 is dynamically defined by the configuration information (reconfiguration information, function configuration information). The individual cells 11 may be independently reconfigured or a plurality of cells 11 may be simultaneously reconfigured. The logic operations (i.e., circuit configuration) of the cells 11 are reconfigured in a minimum time of one clock cycle (one cycle) to make it possible to use the reconfigured logic operation. Although it is also possible for the cells 11 to be set so that the same logic operation is carried out across a plurality of clock cycles, such situation can be understood as the cells 11 being reconfigured so that the same logic operation is carried out in single clock cycles.

Figure 7:
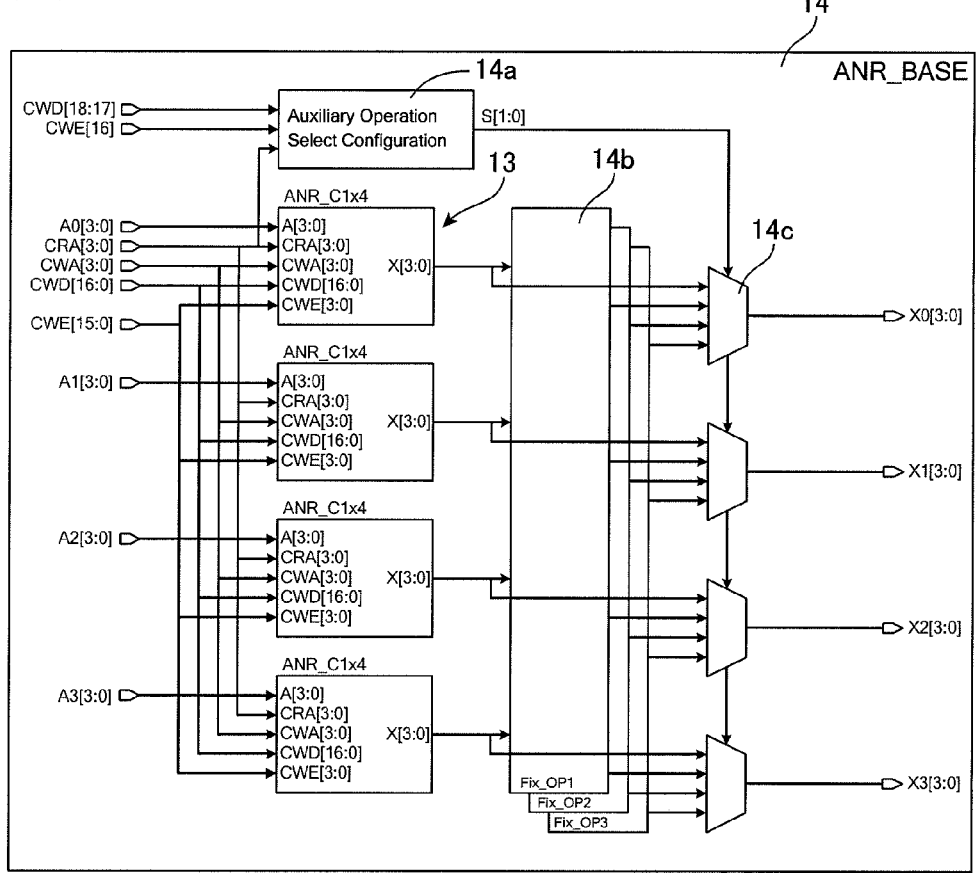
FIG. 7 is a diagram of an ANR-BASE module.
Figure 8:
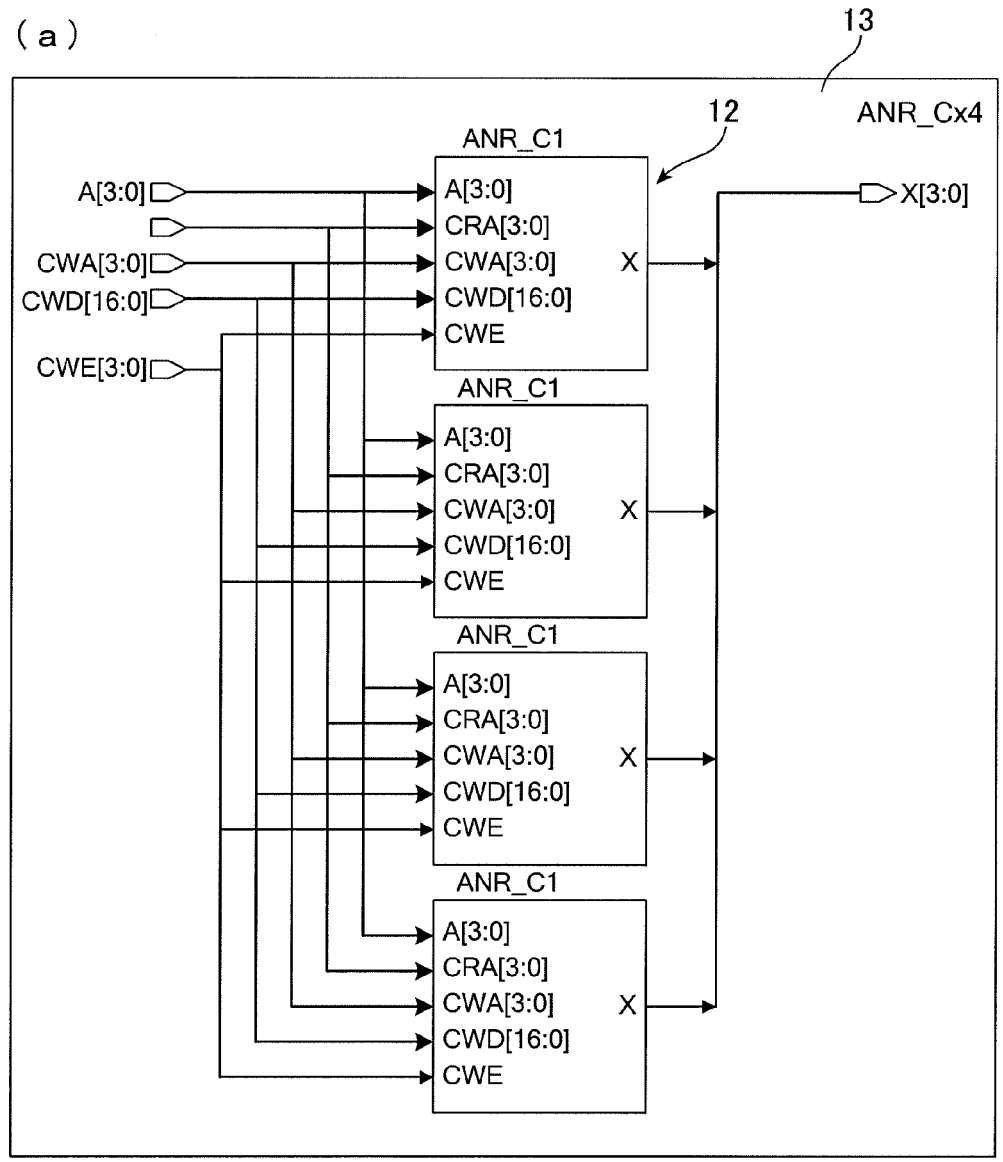
FIG. 8 is a diagram of an ANR-C1×4 module.

FIGS. 7, 8 and 9 show the hierarchical configuration of the cells 11 used in the ANR 10. FIG. 7(*a*) shows the configuration of a cell (element) 11. Such cell 11 is also referred to an ANR-BASE module 14. The ANR-BASE module 14 is a top module of a function cell of the ANR 10 and includes four ANR-C1×4 modules 13, three types of fixed auxiliary logic modules 14*b*, selectors 14*c* that select the outputs of the auxiliary logic modules 14*b*, and an auxiliary operation configuration selection unit 14*a* that controls (decides) the content of an auxiliary operation by controlling the selectors 14*c*. Although the fixed auxiliary logics supported by the auxiliary logic modules 14*b* is not specified or not limited, such logics may include carry look ahead for addition (summation) operations and auxiliary logic aimed at a decoder.

FIG. 7(*b*) shows a terminal chart of the ANR-BASE module 14. The ANR-BASE module 14 is a module (element) that is capable of carrying out logic operations with four 4-bit inputs and four 4-bit outputs. The logic operation to be reconfigured is designated by a configuration reservation address CRA. Configuration information (configuration setting information) CWD for reconfiguring is transferred to each ANR-BASE module 14 with appropriate timing, is written in advance into an address in a configuration memory that has been reserved by a configuration setting address CWA, and is read out using the configuration designating address CRA.

FIG. 8(*a*) shows the configuration of an ANR-C×4 module 13. Such ANR-C×4 module 13 is constructed from the four ANR-C1 modules 12 and carries out a logic operation with a single 4-bit input (four 1-bit inputs) and a single 4-bit output. FIG. 8(*b*) is a terminal chart of the ANR-C×4 module 13.

FIG. 9(*a*) shows the configuration of an ANR-C1 module 12. The ANR-C1 module 12 is a logic element with four 1-bit inputs and one 1-bit output that carries out a logic operation defined by 3-bit function configuration information CWA. The ANR-C1 module 12 includes a configuration memory (configuration RAM) 12*a* with a capacity of 17 bits by 16 words, a read-side address decoder 12*b* into which the configuration designation address CRA is inputted, a write-side address decoder 12*d* into which the configuration setting address CWA is inputted, a data input interface 12*c* into which the configuration setting information CWD is inputted, an output-side selector 12*e* from which the a result where the input data A has been logically operated by logic selected by the configuration designation address CRA is outputted, and a selector 12f that selects the output X from the direct operation result of the combinational circuit and the output as a sequential circuit with timing set by the FF 12g.

The timing chart in FIG. 9(b) shows the timing at which the configuration designation address CRA is supplied, the timing at which the input A is supplied, and the timing at which the result X of the selected logic operation is outputted. FIG. 9(c) also shows a terminal chart of an ANR-C1 module 12.

In the ANR-C1 module 12, by setting a value composed of 16 types of "0/1" pattern for four inputs (i.e., a 4-bit input) as the configuration information, it is possible to realize (implement) a combinational circuit that carries out an arbitrary logic operation. The ANR-C1 module 12 has a four-input, one-output circuit structure defined by the function configuration information CRA as a basic cell and is capable of selecting whether to output as a combinational circuit or to output as a sequential circuit with timing using the FF 12g. A maximum of 16 types of configuration information CWD can be stored in the RAM (or FF) 12a and the stored configuration information CWD can be switched in single clock cycles according to the configuration designation address CRA. Accordingly, the ANR-C1 module 12 is a logic operation element that can be dynamically reconfigured in one clock cycle.

The ANR-C×4 module 13 shown in FIG. 8(a) is set as a single element in which four ANR-C modules 12 that have the same input signals (four signals) A are combined. The ANR-BASE module 14 shown in FIG. 7(a) is constructed of four of the ANR-C×4 modules 13 shown in FIG. 8(a) as a single function cell. Switching control for the configuration information CWD may be carried out by supplying the configuration designation address CRA from an external controller, such as the CPU 2b, based on an external event or the like, or may be carried out autonomously by having the configuration designation address CRA generated inside the ANR 10. Switching control for the configuration information CWD may be carried out by generating the configuration reservation addresses CRA in a predetermined order or cyclically according to events inside an ANR-BASE module 14, an ANR-C×4 module 13, and/or an ANR-C1 module 12.

The function configuration information CWD is loaded from an external memory using a dedicated bus before a predetermined application, function, or logic is executed. Dedicated wiring that delivers the configuration information CWD may be provided, or shared use may be made of the data transfer wiring channel 20. By repeatedly using the configuration information CWD inside the memory 12a, it is possible to reduce the hardware and the temporal cost required to rewrite the configuration information CWD. By using a two-port RAM or the like, the rewriting of the configuration information CWD can be changed both during execution and during idling by a function cell 11.

Figure 10:
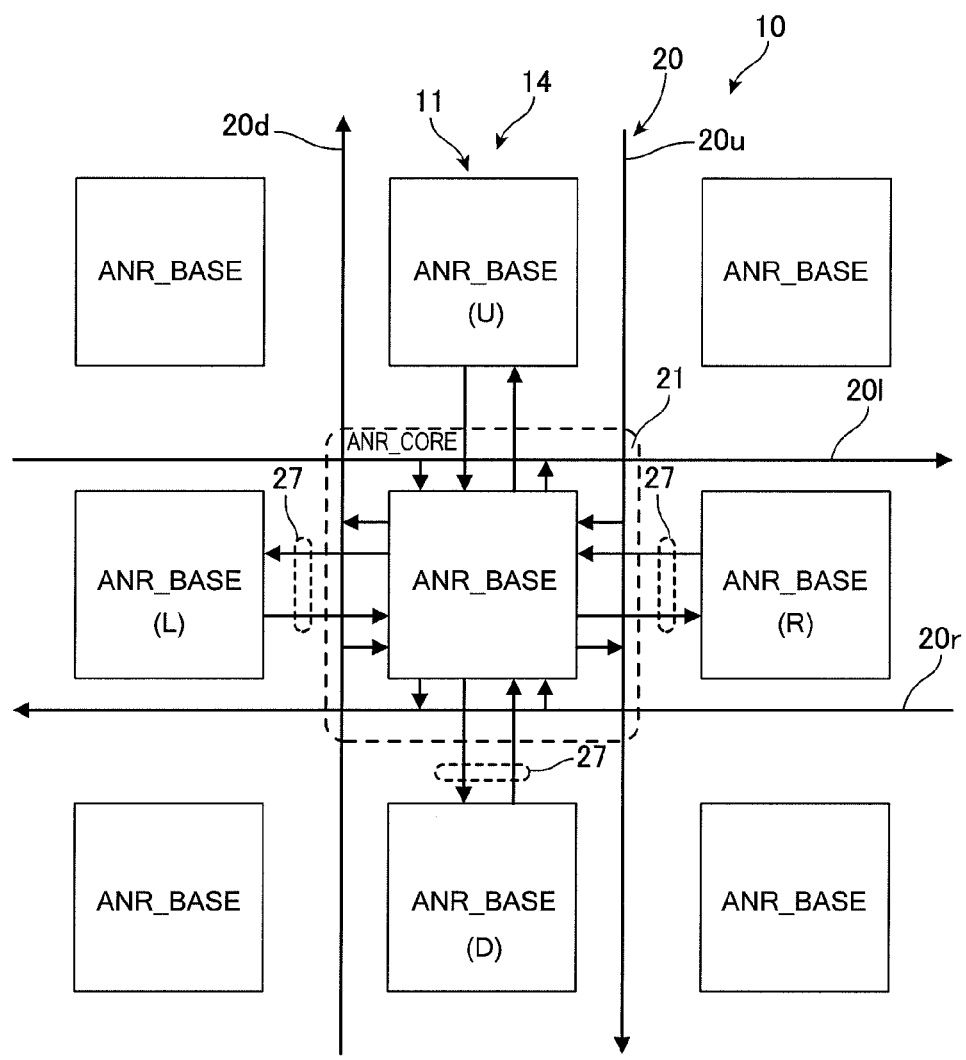
FIG. 10 is a diagram of a wiring channel cell.

The connection configuration of the wiring channel cell (ANR-CORE) 21 is shown in FIG. 10. The ANR-CORE 21 includes a function cell 11 (ANR-BASE module 14) and a wiring channel 27 for transferring the output data of the cell 11 to an adjacent function cell 11 or to a function cell 11 that is separated by one or more cells. The ANR-CORE 21 also includes a connection circuit for connecting to the global connection channels 20. The selection of the transfer source according to the wiring channel 27 and the global connection channels 20 and the designation of the transfer timing is dynamically changed according to the wiring configuration information, so that it is possible to change the selection of transfer source in a minimum of one clock cycle.

The wiring channel cell (interconnection channel cell, connection channel cell, ANR-CORE) 21 has a function cell 11 (ANR-BASE 14) included thereinside and the ANR 10 is constructed by connecting the wiring channel cells 21 as each wiring channel cell being a tile. The basic functions of the ANR-CORE 21 are as follows.

Output data (each of which is sixteen-bit) from the four function cells 11 adjacent in the up, down, left, and right directions are fetched, selected according to the wiring configuration information, and set as the input of the present function cell (own function cell) 11.

The global wiring channels 20 are provided for data transfers that pass over cells 11. The global wiring channels 20 that are managed (connected) for respective ANR-CORE 21 (in units of the ANR-CORE 21) are composed of two channels 20d and 20u in the down and up directions and two channels 20l and 20r in the left and right directions, and data transfers on the respective channels 20 may have directionality (from top to bottom, from bottom to top, from right to left, and from left to right).

Tag information or the like is not included in the data on the global wiring channels 20, and data transfers are carried out by combining the transmission timing of the ANR-CORE 21 that is the transmission source and the reception timing of the ANR-CORE 21 that is the transmission destination. In one time slot (in a single time slot), only one function cell 11 is capable of outputting data to a wiring channel to be occupied out of the global wiring channels 20. Such scheduling is carried out in cooperation with the configuration information.

The global wiring channels 20 are capable of being driven from a plurality of cells 11, with scheduling being used to avoid conflicts. The physical means used for multiple driving is decided according to the processing technology, cell specification, or the like that is used in reality. As one example, a wired OR configuration can be used.

The wiring channel cell (ANR-CORE) 21 has a bridge mechanism that connects global wiring channels 20 inside the wiring channel cell (ANR-CORE) 21. By doing so, data from the left or right wiring channels 20l or 20r can be transferred to the up or down wiring channels 20d or 20u, with transfers in the opposite direction also being possible.

Four signals from the adjacent function cells 11 and four signals from the global wiring channels 20 are inputted into a wiring channel cell 21, with each input having a 16-bit bus format. Accordingly, a total of 128 input signals are connected to the ANR-CORE 21. To have such input signals selected with complete freedom, sixteen 128:1 selectors (which are individually selected) would be necessary. For this reason, the circuit scale is suppressed by applying the two restrictions given below.

The output of an element unit (ANR-C×4) unit 13 (output on an element by element) is used as a fixed input for another element. As examples, the output of bit 0 of each element 13 is only connected to bit 0 of element inputs and bit 1 is only connected to bit 1. By doing so, the connection relationship becomes 32:1. However, although the bit position relationship is fixed between elements, by shifting the configuration to a bit at the position to be connected, this is effectively not a logical restriction.

The adjacent wiring channels 27 and the global wiring channels 20 from the same direction are switched on an element-by-element basis.

The ANR-BASE module 14 has an interface for four input-outputs for the adjacent modules 14 and four input-outputs for the global wiring channels. In the ANR-CORE 21, based on wiring configuration information that is internally held, necessary data on the transfer source is referred to at the necessary timing.

Figure 11:
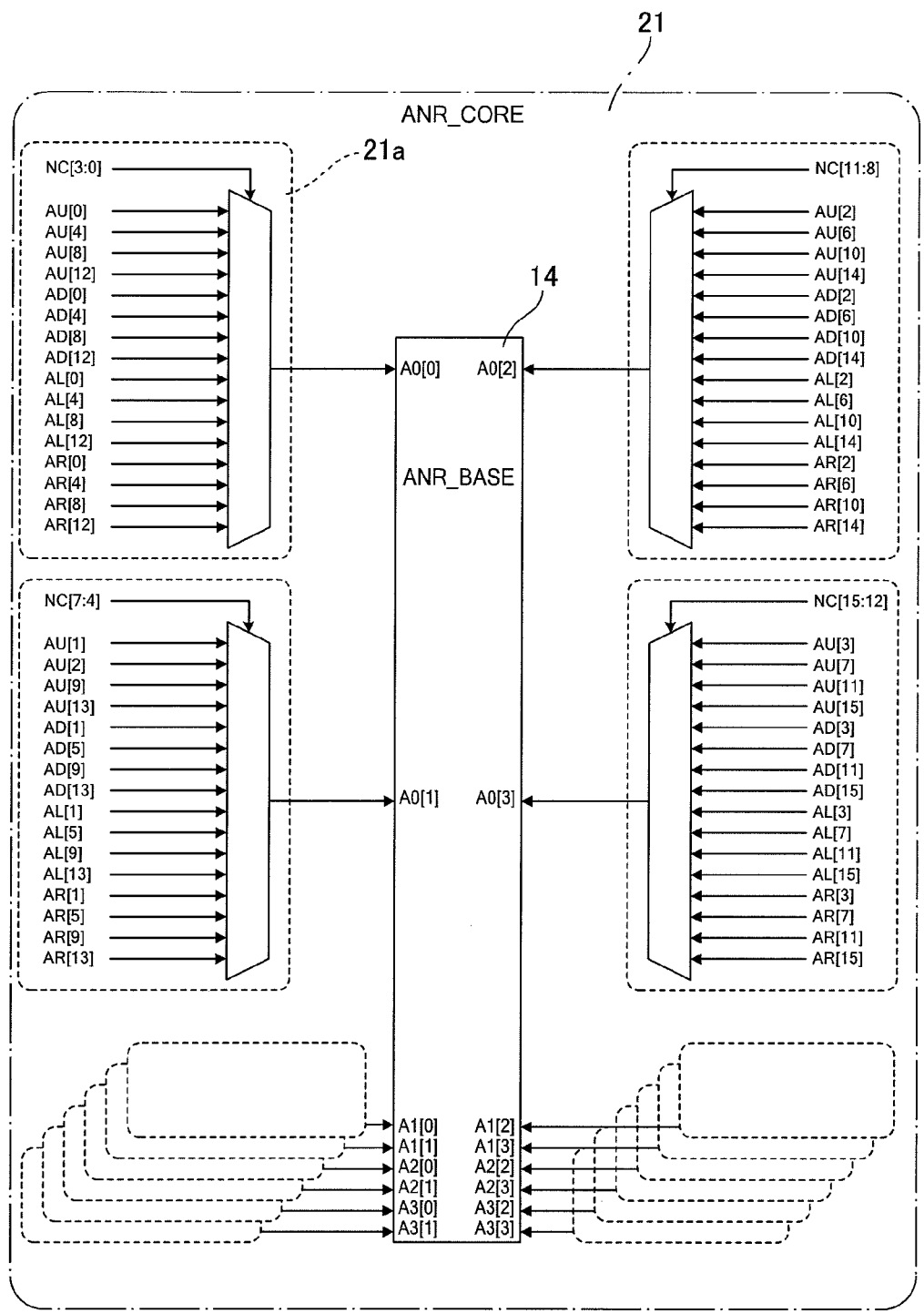
FIG. 11 is a diagram of a wiring channel cell.

FIG. 11 shows the connection configuration of a wiring channel cell (ANR-CORE) 21. The ANR-CORE 21 includes the ANR-BASE module 14 and the interface 21*a*. The interface 21*a* includes an interface with four input-outputs for the modules 14 adjacent to the present ANR-BASE module 14 via the wiring channels 27 and an interface with four input-outputs for the global wiring channels 20. Necessary data on the transfer source is referred to at necessary timing based on the wiring configuration information held inside the ANR-CORE 21. Sixteen inputs into the ANR-BASE 14 can be selected out of the signals from the adjacent modules 14 and the signals from the connection channels 20 as a rule in one bit units (bit-by-bit basis).

Figure 12:
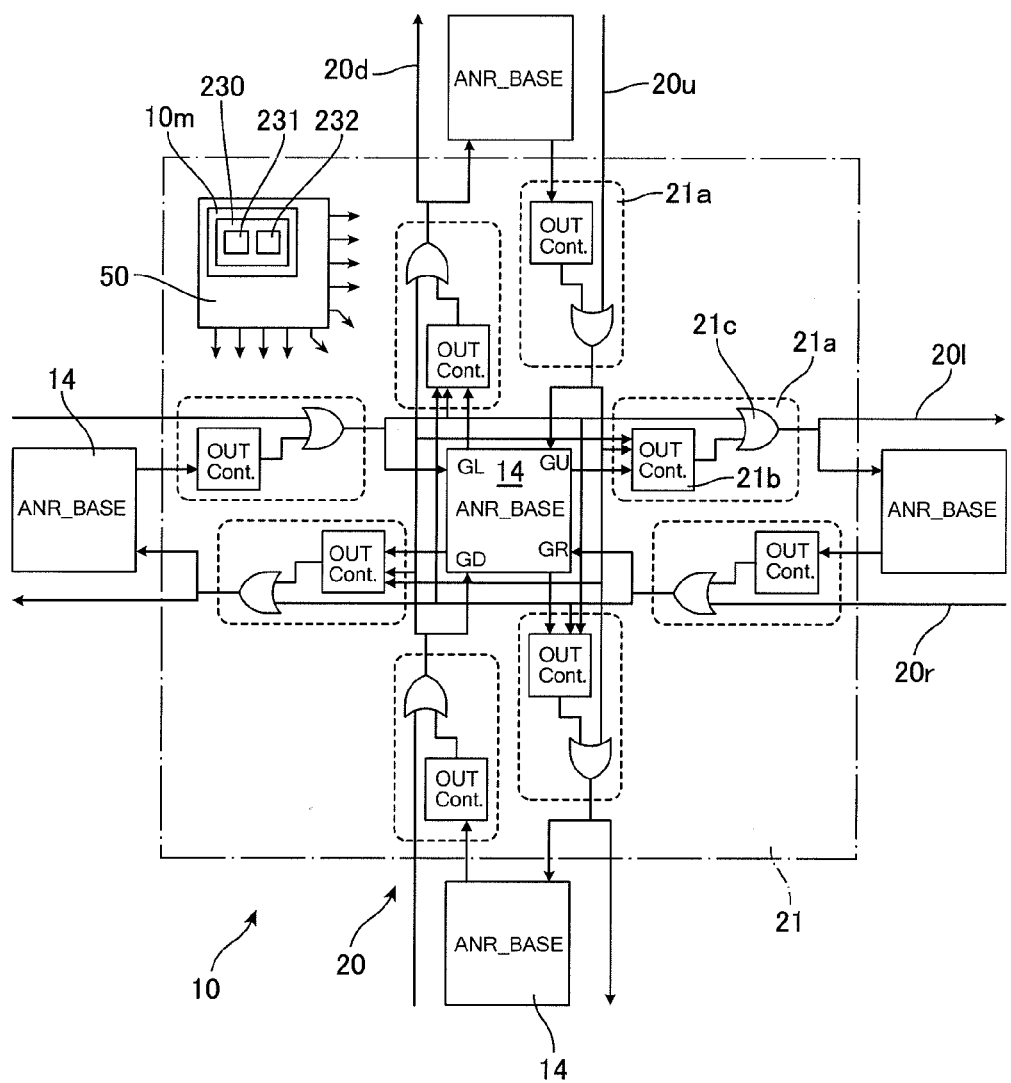
FIG. 12 is a diagram of a wiring channel cell as wired logic.

FIG. 12 shows the configuration of the connections between the ANR-BASE module 14 and the global wiring channels 20 in a wiring channel cell 21. The global wiring channels 20 input into the wiring channel cell 21 from four directions and output in the same directions. Since data is outputted from a plurality of wiring channel cells 21, a connection interface 21*a* for the global wiring channels 20 uses a wired OR configuration in logical terms. The connection interface 21*a* includes an output control unit 21*b* that selects the output from the ANR-BASE module 14, and an OR gate 21*c* that receives the output selected by the output control unit 21*b* and signals transmitted from the global wiring channels 20.

Signals inputted from the global wiring channels 20 in different directions are inputted into the output control unit 21*b*. Accordingly, the connection interface 21*a* has a mechanism for driving by outputting, in addition to the output from the present cell (own cell), data from the left and right directions to the global wiring channels 20 in the up and down directions and outputting data from the up and down directions to the global wiring channels 20 in the left and right directions. The connection interface 21*a* outputs data of the present cell 21 or data of a global wiring channel 20 in a different direction only in respective specified time slots that were assigned when the configuration was set. The assigning of time slots is also carried out when the configuration is set.

One major advantage of the ANR 10 is the effective usage of the wiring channels. With a conventional FPGA, when a connection between one point and another point is necessary, a wiring channel is reserved regardless of whether or not data transfers are made that becomes cause of increasing in wiring cost. The ANR 10 is capable of multiplexed use of wiring channels in a time division. By reconfiguring the function cells 11, flexibility is increased and the amounts of logic and wiring are reduced, thereby constructing a system with high cost performance. To realize such system, in addition to the hardware (chip) of the ANR 10, a high level of software processing is necessary, such as extraction of multiplexed processing according to data flow analysis of an application and precise data transfer scheduling.

The wiring channel cell 21 includes the ANR-BASE module 14 included in the wiring channel cell 21 and a configuration control unit 50 that controls the configuration of the connection interface 21*a* and the like. The configuration control unit 50 includes a configuration memory 10*m* in which configuration information 230 is stored. As described later, the configuration information 230 includes element reconfiguration information 231 and channel reconfiguration information 232.

FIG. 13(*a*) shows a different example of a wiring channel cell 21. The connection interface 21*a* of the wiring channel cell 21 further includes an AND gate 21*d* and as shown by the equivalent gate circuit in FIG. 13(*b*), has a mechanism that drives data by selecting one out of four outputs that are the output from the wiring channel on the preceding stage (that is an additional one), the output from the present cell 21, an output of data from the left or right direction for a global wiring channel 20 in the up or down direction, and an output of data from the up or down direction for a global wiring channels 20 in the left or right direction.

As shown in FIG. 10, the ANR 10 includes local wiring channels 27 that are capable of direct data transfers in the four directions up, down, left, and right for the respective cells (ANR-BASE modules) 14. Accordingly, it is possible to easily cope with a case where a data transfer to an adjacent cell (ANR-BASE module) 14 is carried out. In addition, it is possible to transfer a data operation result back to the cell 14 that outputted the data via a local wiring channel 27. The cell 14 (11) to which the data has been sent back carries out an operation that has been reconfigured to another function in the next timing. Since it is possible for data to be sent back, it is possible to use a physically localized layout of the function cells 14 (11), which facilitates grouping during mapping.

If four signals on the local wiring channels from the adjacent function cells 11 and four signals from the global wiring channels 20 are inputted into a wiring channel cell 21 on 16 bit-buses, the wiring channel cell 21 will be connected to a total of 128 input signals. To have such inputs selected with complete freedom, sixteen 128:1 selectors (which are individually selected) would be necessary. The circuit scale may be suppressed by applying the two conditions given below.

The output of an element unit (ANR-C×4) 13 is used as a fixed input for another element. As examples, the output of bit 0 of each element 13 is only connected to bit 0 of element inputs and bit 1 is only connected to bit 1. By doing so, the connection relationship becomes 32:1. By doing so, although the bit position relationship is fixed between elements, by shifting the configuration to a bit at the position to be connected, this is effectively not a logical restriction.

The local wiring channels 27 and the global wiring channels 20 from the same direction are switched in units of the elements 13. Due to the locality of data, there is a low possibility of the local wiring channels 27 and the global wiring channels 20 from the same direction being mixed.

Figure 14:
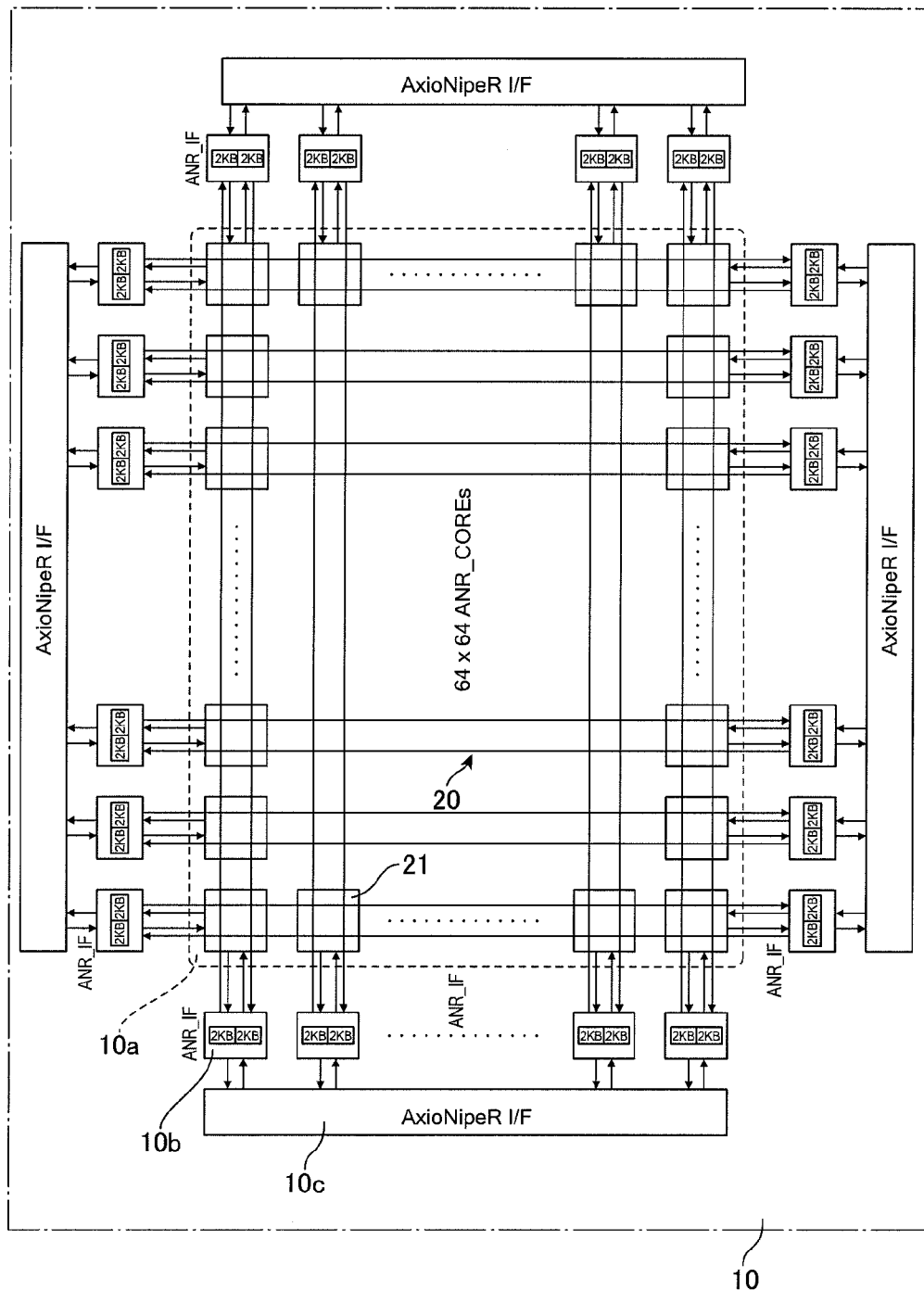
FIG. 14 is a diagram of a network of wiring channel cells.

FIG. 14 shows the network configuration of the ANR 10. The ANR 10 has the wiring channel cells 21 as a basic configuration that include the function cells 11. Although the ANR network 10*a* has a basic configuration of 64×64, the configuration is not limited to such. The basic operation of the ANR 10 is a combination of data logic operations and data transfers. For this reason, the ANR 10 needs a supply circuit for input data, a storage circuit for output data, and a supply circuit for configuration information. Such functions are realized by the ANR interface module (ANR-IF) 10*b*. The ANR-IF 10*b* carries out transfers of data and configuration information from the DDR-DRAM 2*a* on an AXI bus 2c, which is the main bus of a digital chip, via the AXI bus interface module (AXI-ANR-IF) 10c.

The ANR-IF 10b connects the wiring channels 21 of a peripheral part of the ANR network 10a and the global wiring channels 20. The ANR-IF 10b carries out data transfers to and from the outside via the AXI bus 10c or dedicated I/O. Although the transferring of the configuration information is carried out by making shared use of the global wiring channels 20, channels dedicated to such transfer may be provided. The ANR-IF 10b has a 2 kbyte buffer for inputting/outputting inside the module and carries out inputs and outputs of data to and from the ANR 10 with 16-bit (1 GHz) burst transfers as a maximum.

Configuration information stored in the DDR-DRAM 2a is supplied to the function cells 21 (11) and the wiring channels 20 via the global wiring channels 20. The configuration information may be transferred to each cell 21 before system start-up commences or may be transferred during operation after system start-up has commenced. It is desirable for analysis of the logic circuits and data flows that are necessary for an entire application to be optimized by software, for configuration information to be transferred to the configuration memories of the respective cells 21 whenever possible before system start-up commences, and for the load of data transfers of configuration information after system start-up has commenced to be suppressed.

Figure 15:
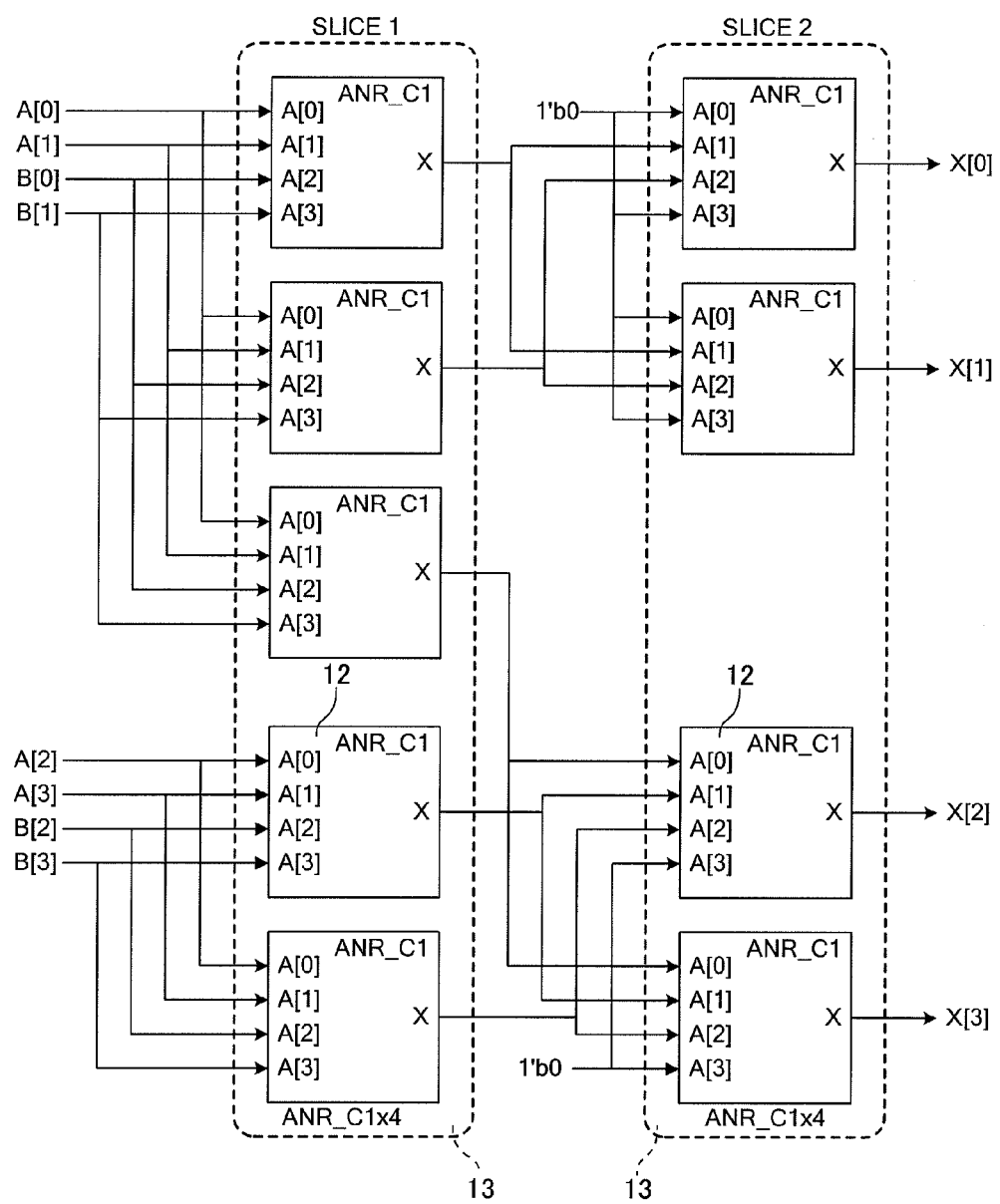
FIG. 15 is an example where logic is implemented by slicing in a time division.

FIG. 15 shows a model for confirming the basic operation of the ANR 10. The operation model shows operations as an adder, a subtractor, a decoder, or the like by changing between six configurations of a module with two 4-bit inputs and one 4-bit output. This model maps the adder part onto the basic cells (ANR-C1) 12. With the present mapping, by dividing into two slices ("slice 1" and "slice 2"), logic is executed and then what is physically the same cell 13 is reconfigured to other logic.

Figure 16:
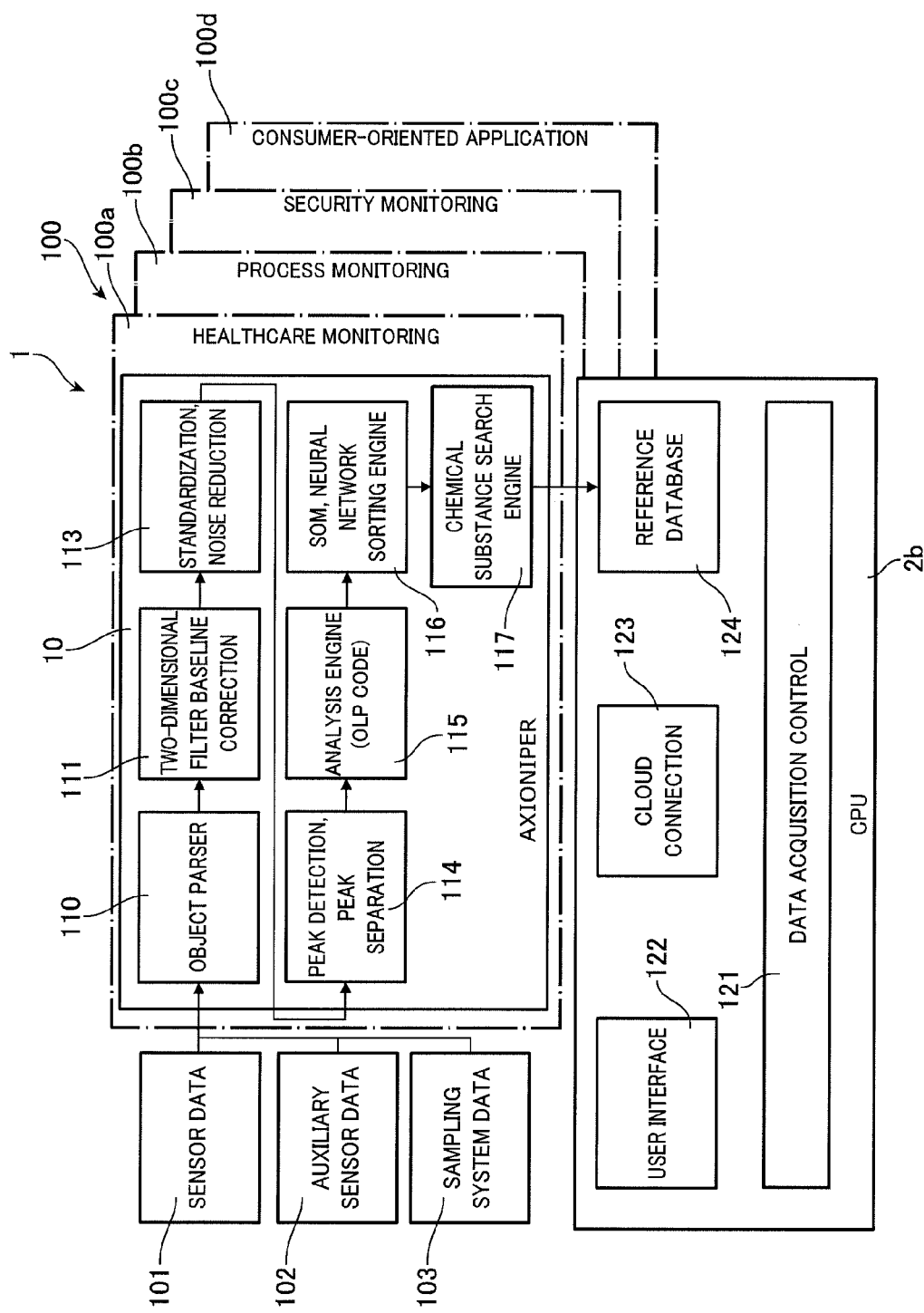
FIG. 16 is an example where an application is implemented with a data processing system as a platform.

FIG. 16 shows an example of a system (OLP) 100 that includes the data processing apparatus (system) 1 equipped with the ANR 10. This system 100 is a system that analyzes data 101 obtained from a sensor such as a FAIMS and is capable of implementing a variety of functions in the ANR 10 in parallel or in time division. The system 100 can be used as a platform for a variety of applications. A number of example applications are healthcare monitoring 100a, process monitoring 100b, security monitoring 100c, and a consumer-oriented odor business application 100d. Aside from data 101 obtained from a sensor such as a FAIMS (ion mobility sensor) or an MS (mass sensor), auxiliary sensor data 102 such as temperature, humidity, pressure, peripheral images, and GPS and sampling system data 103, for example, sampling time, and data relating to the sampled material, are inputted into the apparatus 1.

As examples, a parser 110 that determines the category or the like of a material to be measured and sets analysis conditions, a unit 111 that carries out data correction such as baseline correction, a unit 113 that standardizes peaks to reduce noise, a unit 114 that detects and separates peaks included in the sensor data 101, an analysis engine 115 that determines types (properties, attributes) and amounts from the separated peaks, an engine 116 that sorts or categorizes chemical substances to be measured from information obtained by the analysis engine 115 using a method such as SOM (Self-Organizing Maps) or a neural network, and a unit (function) 117 that carries out a search of a database inside the apparatus or via a network to determine a chemical substance being measured are mapped onto the ANR 10 according to time division.

The CPU 2b supports the reconfiguration of the ANR 10 and also realizes a function that supports processing by the ANR 10. As examples, the CPU 2b provides a function 124 that accesses a reference database, a function 123 that accesses the cloud (a LAN), a user interface function 122, and a data acquisition control function 121. Such functions can be implemented in the ANR 10 using free space and/or free time at the ANR 10.

There is demand for a large-scale parallel data processing engine for detecting and analyzing chemical substances in real time. By detecting and analyzing chemical substances in real time, it is possible to provide revolutionary services to users such as the identification and quantification of biomarkers used for detecting disease, monitoring of health and/or vital functions, and provision of managed care using remote monitoring technologies. The platform for doing so needs to be intelligent, extensible, and to satisfy a variety of demands relating to applications and performance. In addition to functioning as parallel processing hardware, the apparatus 1 that includes the ANR 10 is hardware that is dynamically programmable, which satisfies the needs described above.

One sensor is a FAIMS (Field Asymmetric ion mobility spectrometer). A FAIMS is suited to detection of minute amounts of chemical substances included in air or the like, and attempts are being made to apply FAIMS to a wide range of applications such as security, environmental monitoring, health care, manufacturing processes, energy, and the like. Small and lightweight FAIMS and MS (mass sensors) of a chip level have started to be provided on the market, and by using the apparatus 1 including the ANR 10 that can be realized at chip level as a platform for analysis, it is possible to provide a real-time, low power chemical substance analysis system at chip level that is small, lightweight, and mechanically and thermally resilient.

Figure 17:
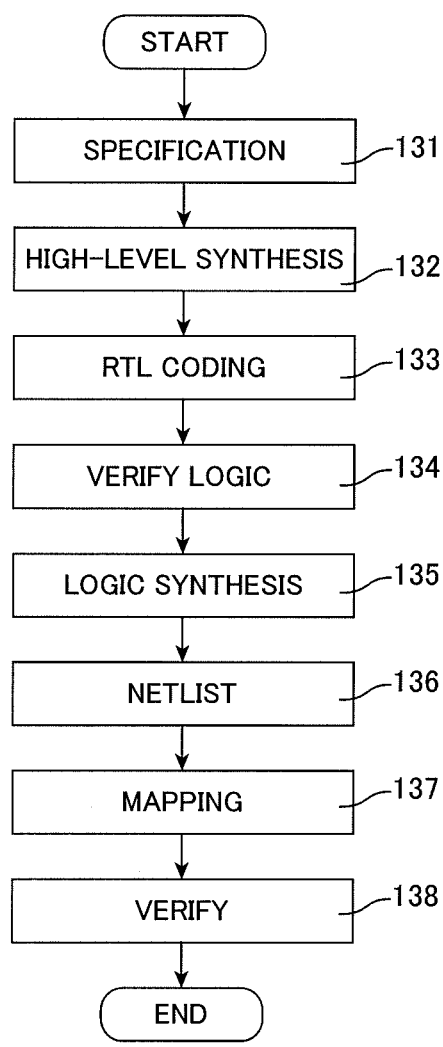
FIG. 17 is an example of a design flow.

FIG. 17 shows the flow (design flow) that generates the netlist 136 from the application (specification) 131 that is to be realized in the apparatus 1 via high-level synthesis 132, RTL coding 133, logic verification 134, and logic synthesis (netlist synthesis) 135, as far as mapping 137 onto the apparatus 1 and board level evaluation 138. A standard design flow is used for the majority of the design flow of the ANR 10. As a difference, the RTL 133 is synthesized to a netlist that is structurally on a gate level with a limited cell library. Primitives supported by a limited cell library are two or three input AND gates, OR gates, XOR gates, invertors, FF, MUX, and the like. Such library can be updated to include other primitives in response to requests regarding performance.

Figure 18:
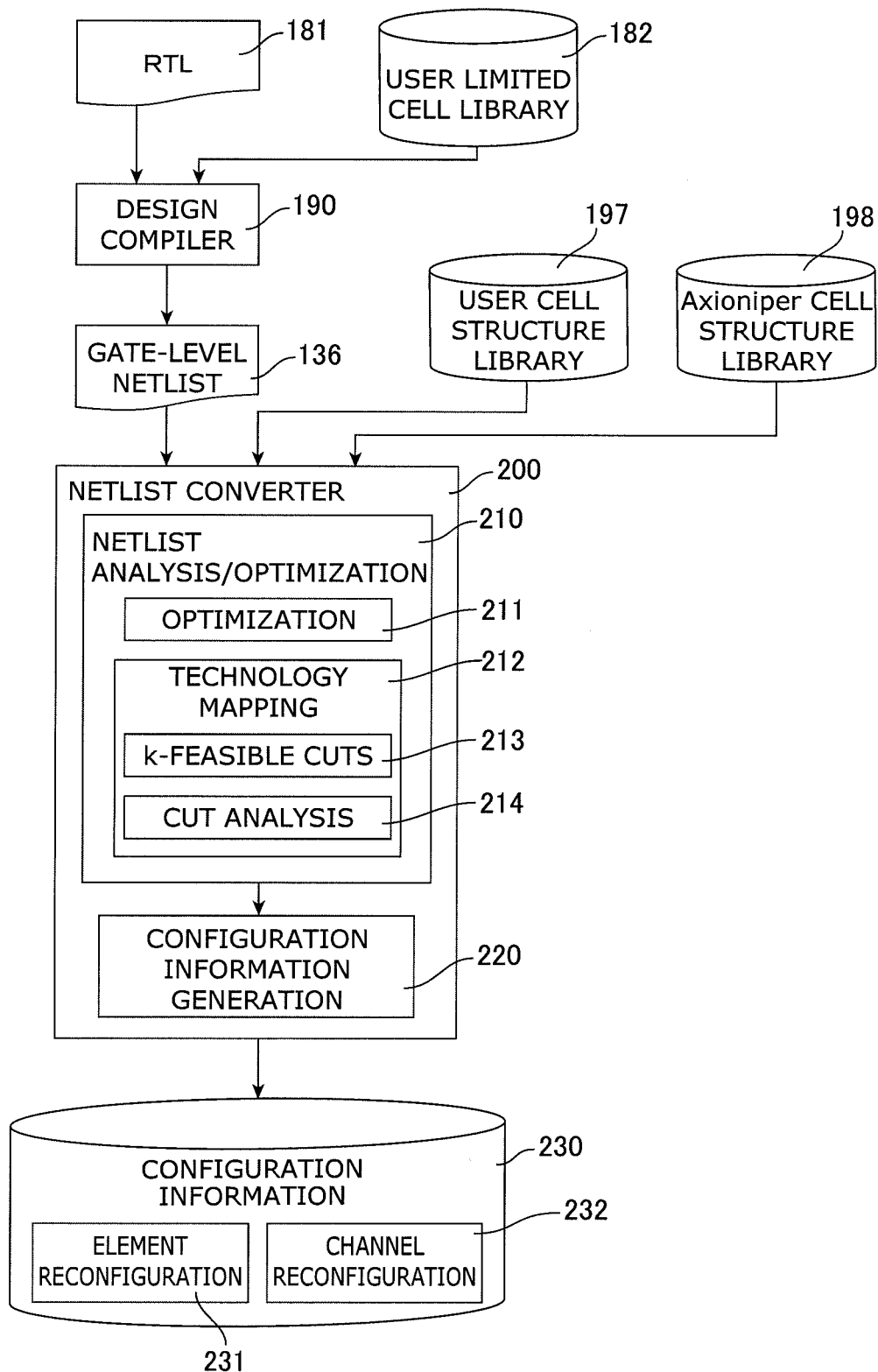
FIG. 18 is a block diagram showing the overall configuration of a netlist converter.

FIG. 18 shows the overall configuration of the system (netlist converter) 200 that generates, from the RTL 181 via the netlist 136, information (configuration information) 230 to be implemented on the ANR 10. The netlist converter 200 is a computer equipped with a CPU and memory and functions as the netlist converter 200 by installing a program (program product) including instructions that executes the functions described below. The netlist (gate level netlist) 136 generated and synthesized based on the specification 131 is converted to the information 230 to be implemented in the function cells 11 that are the mapping target, and when doing so, functions are optimized with total area or delay time as the object. In the present embodiment, the target cell 11 is the ANR-BASE 14 described earlier.

A design compiler 190 generates a gate-level netlist 136 using the RTL 181 and the limited cell library 182 described earlier. Such task includes expressing the provided netlist as a good initial multilevel network of simple gates called a "subject graph". A subject graph can subsequently be converted to a multilevel network of library gates by enumerating different library gates that match the respective nodes in the subject graph (a matching step) and selecting the optimal combination.

The netlist converter 200 generates from the netlist 136, by referring to a user cell structure library 197 and an Axioniper cell structure library (ANR cell library) 198, configuration information 230 to be mapped onto the ANR 10. The configuration information 230 includes element reconfiguration information 231 that reconfigures the resources that are the units (elements, blocks, cells) for implementing logic operations and channel reconfiguration information 232 that reconfigures the channels that connect such units (elements). The netlist converter 200 includes a netlist analyzing/optimizing unit 210 and a configuration information generating unit 220. The netlist analyzing/optimizing unit 210 includes an optimizing unit 211 and a technology mapping unit (analyzing unit) 212. The technology mapping unit 212 includes a unit 213 that carries out k-feasible cuts and a unit 214 that analyzes the cuts.

The ANR-C1 module 12 that is the basic component of the ANR-BASE module 14 is interpreted as a configuration that includes a 4-bit input LUT and an FF as basic elements. The ANR-C1×4 module 13 constructed by four ANR-C1 modules 12 is interpreted as a configuration that includes four LUT and four FF. Accordingly, the mapping unit 212 includes a function as an LUT-based technology mapping unit.

FIG. 19(a) shows a full adder gate circuit as one example of combinational logic, FIG. 19(b) shows a truth value table 142, and FIG. 19(c) shows how the truth value table 142 is implemented in an LUT 143. Such combinational logic is implemented in the LUT 143 that has the same numbers of inputs and outputs of the logic. The LUT 143 includes three inputs 143$i$ and two outputs 143$o$.

The size of the truth value table becomes exponentially larger based on the number of inputs. If there are three inputs, the table has eight rows, if there are four inputs, the table has sixteen rows, and if there are five inputs, the table has thirty-two rows. The number of rows in the truth value table and the LUT is the same, and the LUT becomes exponentially larger based on the number of inputs. The number of bits in the SRAM inside the LUT is expressed by $2^i \times o$, where i is the number of inputs and o is the number of outputs. As one example, with combinational logic with sixty-four inputs and one output, $2^{64}$ ($1.84 \times 10^{19}$) SRAM bits are necessary. To use such a large LUT is clearly impossible.

The ANR 10 includes the cells 12 to 14 that have a hierarchical structure, it is possible to configure LUTs with such cells as units, and also possible to map circuits (logic operations) on such plurality of LUTs. Accordingly, by dividing the circuit to be implemented into small circuits that fit into LTUs (with the same number of inputs and outputs), a situation where the size of the LUT becomes huge is avoided. The LUT-based technology mapping unit 211 divides the netlist 136 so as to fit into LUTs with three inputs and two outputs, for example.

FIG. 20(a) shows an example where the netlist 171 that uses a limited cell library 182 has been converted to the netlist 172 to be mapped onto the ANR 10. The netlist 172 for mapping onto the ANR 10 corresponds to the configuration information 230 including the element reconfiguration information 231 and the channel reconfiguration information 232. In this example, the netlist 171 is decomposed so as to fit in LUTs with three inputs and two outputs to generate a netlist 172 that has the four-input, four-output ANR-C1×4 module 13 shown in FIG. 20(b) which is mapped onto the ANR 10.

Figure 21:
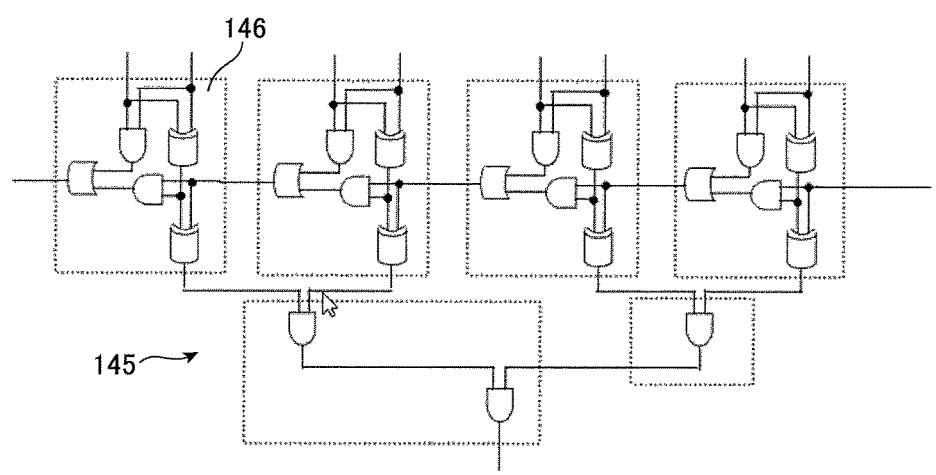
FIG. 21 is an example where a different netlist is implemented.

FIG. 21 shows an example where the netlist 145 is decomposed into a four-input element 146. The number of gates included in the logic circuits used for implementation when dividing into elements does not affect mapping onto LUTs. What is important is the number of inputs and outputs when decomposing into elements. Although it is not typical for a large-scale circuit to have only two or three inputs, if such a large scale circuit has the same number of inputs as a small scale circuit, such circuit may be implemented in a single three-input, one-output LUT.

Figure 22:
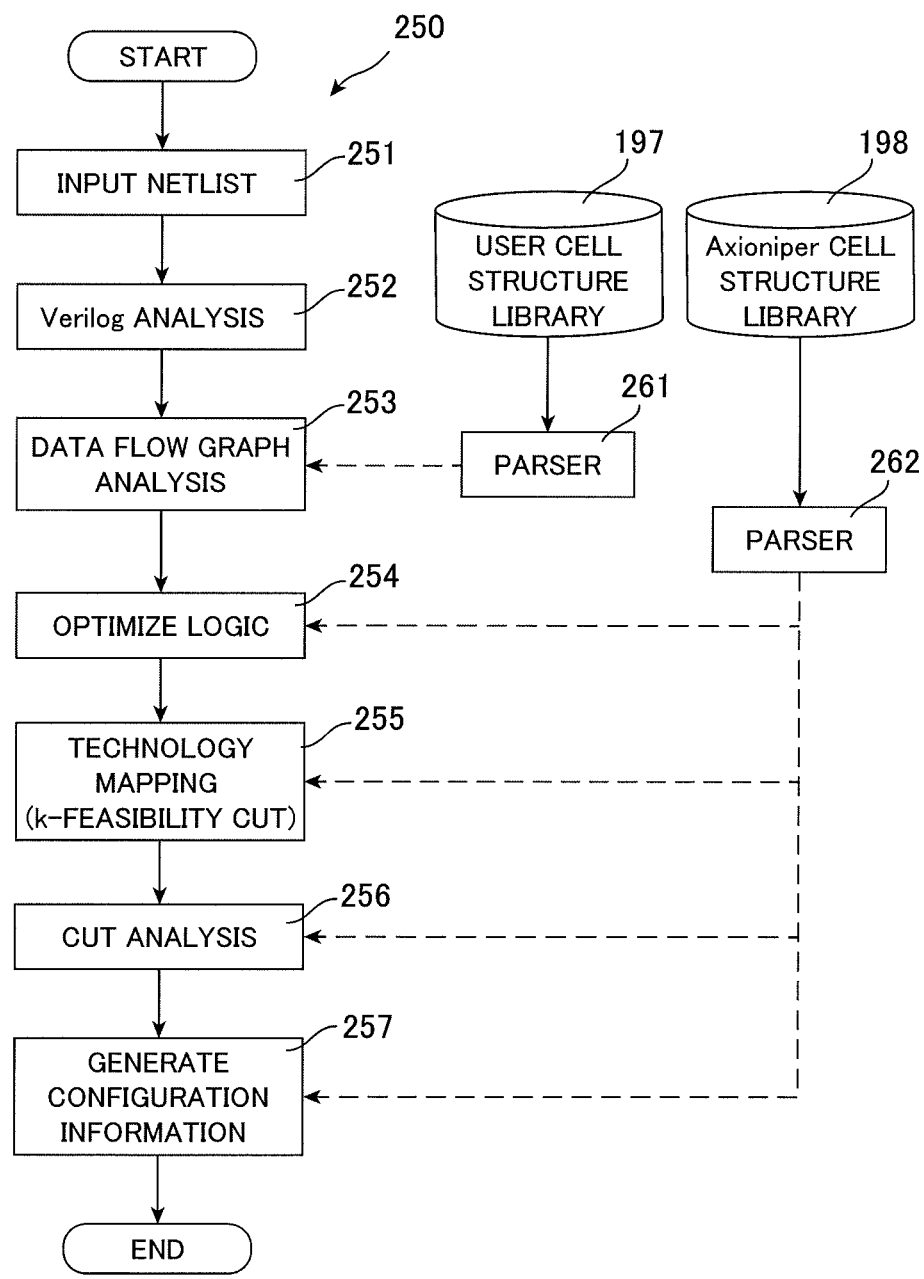
FIG. 22 is a flowchart showing an overall process that generates configuration information in a netlist converter.

FIG. 22 shows, by way of a flowchart, the process 250 where the netlist converter 200 generates the configuration information 230 that reconfigures the ANR 10, which is a logic operation unit (logical operation part). The process (generation method) 250 that generates the configuration information is provided, via a network or in a recorded state on an appropriate recording medium, as a program (program product) that causes a computer including hardware resources such as a CPU and memory to operate.

In step 251, the netlist 136 is read out, in step 252, Verilog analysis is carried out, in step 253, data flow graph analysis is carried out, and in step 254 the logic is optimized. After this, in step 255 technology mapping including k-feasible cuts is carried out and in step 256 the result of such cutting is analyzed. Based on the result of this analysis, in step 257, the configuration information 230 including the element reconfiguration information 231 and the channel reconfiguration information 232 is generated.

In the Verilog analysis (Verilog parser) in step 252, an intermediate data flow graph that has not been optimized is constructed from the netlist 136 that is structurally on a gate level and has limited cells. In the data flow graph analysis in step 253, the multi output AIG (And-Invert-Graph) is constructed for each primary output of the circuit. In the data flow graph analysis, the user cell structure library 197 is referred to via a parser (function cell parser) 261, different library gates that match each node in the graph are enumerated, and are converted to a multi-level network of library gates.

The logic optimization in step 254 is an important step in the design flow. The logic is optimized in order to delete redundant logic. During optimization of the logic, optimization of technology independent logic is carried out first. One optimization is simplification, where the method of expressing functions is changed. After this, the network is reconstructed. For example, nodes are added and deleted. In addition, the delay time is reconstructed. As one example, optimization that reduces the height of critical paths is carried out. The circuit improvement based on cost is also carried out. It is also conceivable to maintain the same functionality. In addition, optimization (Boolean evaluation/ decomposition) using a Boolean network and optimization in the form of simple factoring and literal minimization are carried out. In the following processing, the Axioniper cell structure library 198 is referred to via the parser 262.

Figure 23:
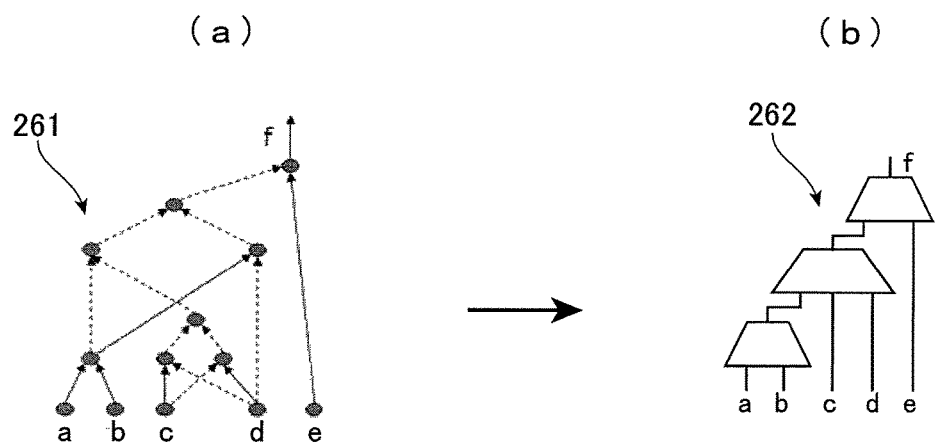
FIG. 23 is an example of optimization by a Boolean network.

FIG. 23 shows an example of Boolean evaluation. FIG. 23(a) shows an example of the inputted Boolean network 261. FIG. 23(b) shows a circuit 262 where a network is implemented using a plurality of LUTs in a state where optimization has been carried out using an appropriate cost function.

In the present embodiment, in step 255, the ANR-C1 module 12 is selected as the minimum element for reconfiguration and technology mapping onto the ANR-C1 modules 12 is carried out according to LUT-based technology mapping. In LUT-based technology mapping, a netlist is mapped onto LUTs so as to minimize the area and/or delays. Latency is optimized in the LUT mapping algorithm as a whole.

In step 255, the mapping unit 212 cuts the AIG using a combination of nodes for technology mapping. The node cutting unit 213 of the mapping unit 212 exhaustively enumerates all of the cuts (k-feasibility cuts) for nodes in the AIG with the structure representation AIG as an input representation. Cuts show combinations of nodes into which logic can be separated. During technology mapping, a cut that has an optimal latency number is selected and mapping is carried out according to a heuristic approach. "K-feasibility cut" refers to a case where the size after cutting is an integer k or smaller.

Figure 24:
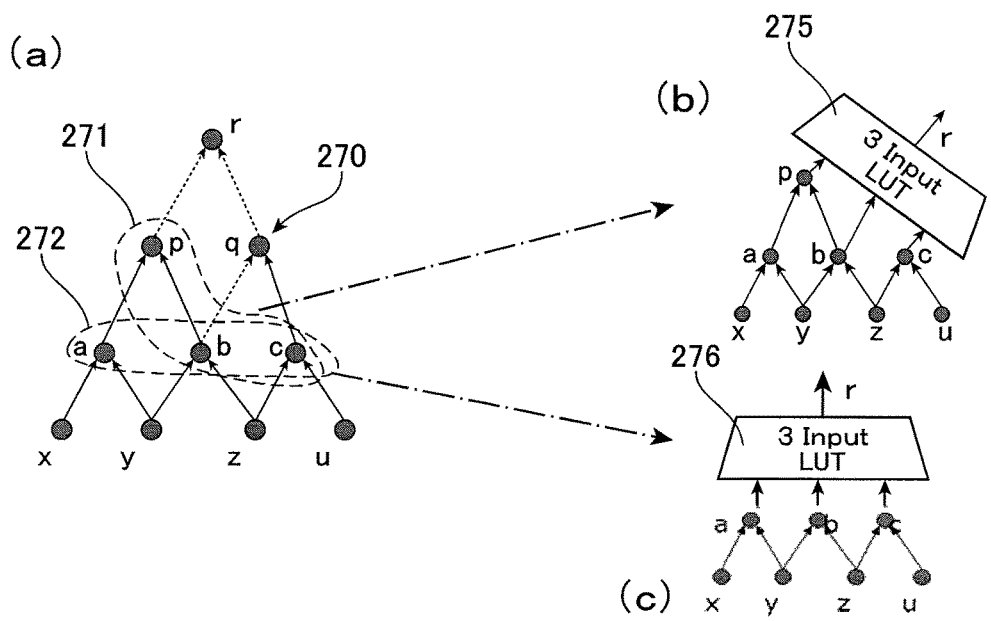
FIG. 24 is a diagram showing how processing separated into cuts (combinations of nodes) is implemented by LUTs.

FIG. 24 shows an example of a k-feasibility cut. Although the number of inputs of the ANR-C1 modules 12 that are the elements in the present embodiment is four and a search is performed for 4-feasibility cuts, to simplify the explanation, 3-feasibility cuts are described below as an example. In the structural representation AIG 270 in FIG. 24(a), the cuts (a, b, c) 272 and the cuts (p, b, c) 271 are 3-feasible cuts of the node r. By carrying out k-feasible cuts, the latency can be adjusted. The logic between a node and a node present in its cut is also replaced with a k-LUT (in the present embodiment, a three-input LUT) 275 or 276 as shown in FIG. 24(b) and (c).

In step 255, out of all of the cuts for the respective nodes included in the netlist 136, k-feasible cuts (4-feasible cuts) where the number of nodes after cutting is no greater than the number of inputs (4) of the element, in the present embodiment, the four-input ANR-C1 module 12, for which technology mapping is carried out are enumerated and a technology mapping process is carried out for the respective cuts. When doing so, a set of cuts for which the best latency and area are obtained is selected. The integer k is an integer that is at least one and no greater than the number of inputs of an element. Since the number of inputs of an element will fundamentally not be several hundred, it is desirable for the integer k to be 256 or lower, with 32 or lower being even more preferable and 16 or lower being more preferable still.

Figure 25:
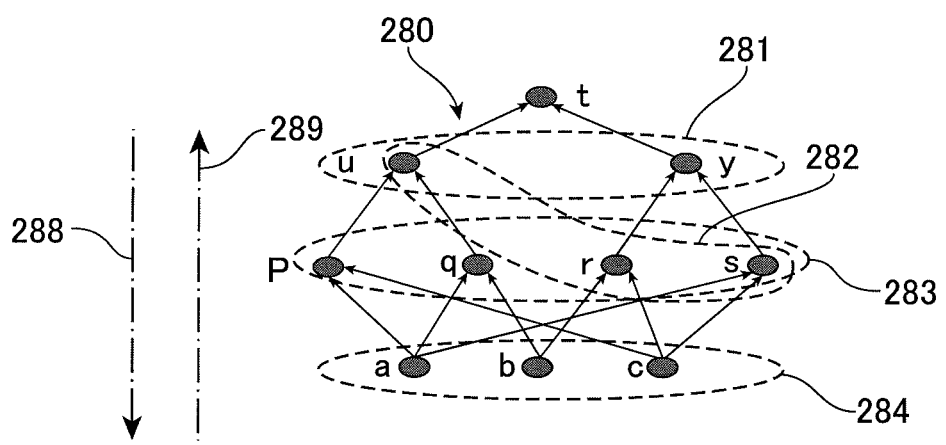
FIG. 25 is a diagram showing a method of searching for cuts.

Examples of approaches for exhaustively acquiring a set of all of the k-feasible cuts are a bottom-up approach and a top-down approach. In the AIG 280 shown in FIG. 25, in the bottom-up approach 289, calculation of cuts is carried out in a bottom-up manner and cuts of a size that is larger than k are discarded. In the top-down approach 288, first a cut (u,y) 281 of the node t is expanded. By replacing the node y with its cut (r,s), a new cut (u,r,s) 282 of the node t is expanded. After this, cuts are expanded in the same way.

When cuts are enumerated exhaustively, an extremely large number of combinations are possible. For this reason, it is possible to use a process that discards an appropriate number, for example cuts where k is 7 or higher. However, it is necessary to recognize the "fat belly" issue. That is, in the top-down approach 288, even if the integer k of the feasible cuts is 3, to acquire a cut (a,b,c) 284 of the node t, it is necessary to expand beyond a cut (p,q,r,s) 283 that is a fat belly where k is four or higher. Accordingly, step 255 includes a process that generates intermediate cuts that are larger than the integer k in order to obtain all of the k-feasible cuts.

In step 255, a subset F (factor cuts) may be enumerated in place of enumerating all of the k-flexible cuts. Other k-feasible cuts can be easily generated from the subset F.

In step 256, the cut analyzing unit 214 of the mapping unit 212 exhaustively analyzes the k-feasible cuts obtained as described above. One of the most important factors is to detect the duplication of cuts. Duplicated cuts have the possibility of being implemented in the same ANR-C1 module 12. Since the inputs of duplicated cuts match, there is the possibility that it will be possible to implement in another ANR-C1 module 12 that is included in the same ANR-C1×4 module 13 on a higher level.

Another factor (item to be focused) is the compression of the enumerated cuts. By gathering a plurality of cuts that include k or fewer nodes into a cut of k nodes, there is the possibility that it will be possible to implement in a single ANR-C1 module 12. Yet more factors are the domination of cuts and the optimization of k.

In step 257, based on the analysis result of cuts, the generation unit 220 generates the configuration information 230 that includes information 231 that reconfigures the ANR-C1 modules 12 that are the elements and information 232 that reconfigures the connections of the ANR-C1 modules 12 including the global channels 20. In this step 257, the element reconfiguration information 231 and the channel reconfiguration information 232 are divided in time and divided into units for reconfiguring the ANR 10 that is a logic operation unit, and the configuration information 230 that is to be loaded into the ANR 10 is generated.

FIG. 26 shows an RTL representation 291 of an 8-bit encoder as an example of an RTL. This representation has nine inputs and three outputs. To obtain a gate level netlist 136 that has a limited cell library, the RTL 181 is sent to a design compiler 190 or similar synthesis tool.

FIG. 27 expresses code 292 of an equivalent gate level netlist 136 that has been generated by the design compiler 190 using a limited cell library 182. Such code 292 is provided as an input to the netlist converter 200.

Figure 28:
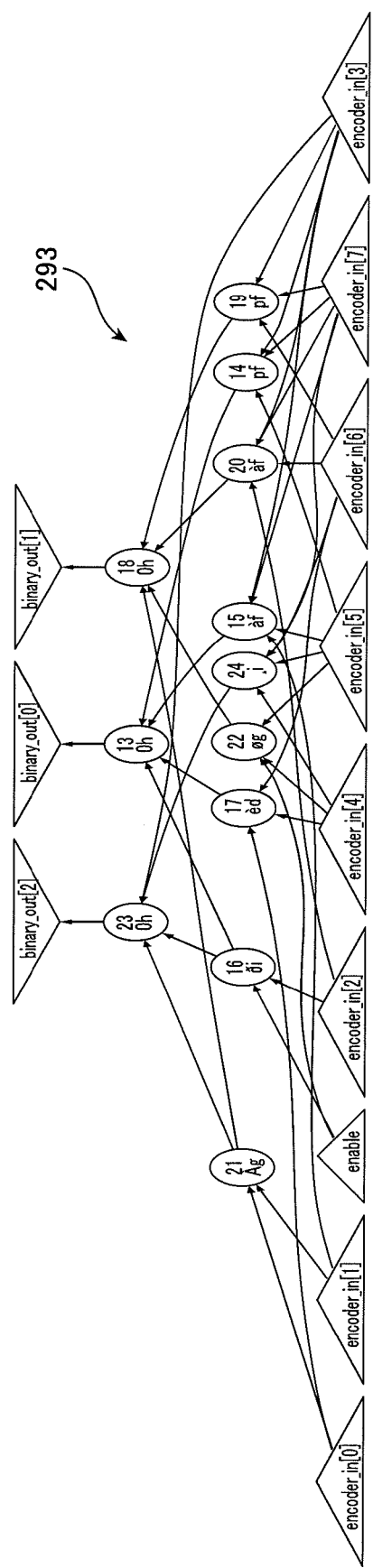
FIG. 28 is a diagram showing an example of a data flow graph.

FIG. 28 shows the data flow graph 293 after synthesis. The input and outputs of the gate-level netlist are shown by triangles as a graphical representation. The respective intermediate nodes are displayed by circles. This graph is a state after optimization using the standard logic optimization steps including network reconfiguration and Boolean evaluation and decomposition, where the number of intermediate nodes has been reduced from 29 to 12.

FIG. 29 shows the mapping information 294 of the respective nodes. The respective equations can be mapped onto a single ANR-C1 module 12. FIG. 30 shows an algorithm 295 for packing onto the core (ANR-C1 module) 12. First, the logic that has the largest number of inputs for an ANR-C1 module 12 is selected, logic that has the largest number of inputs or outputs shared with such module is then selected, and this is repeated until the number of inputs overflows. A combination where the required number of ANR-C1 modules 12 is the lowest is then found. For example, the above is repeated until an optimal number for implementing in a state where the ANR-C1×4 modules 13 are included in the ANR-BASE module 14 is obtained.

As shown in FIG. 29, the node n14 and the node n15 share three inputs and the maximum number of inputs between such two nodes is four. Such two nodes are combined to form a single node. In the same way, the nodes n19 and n20 are combined to form a node n18.

FIG. 31 shows the mapping information 296 of the respective nodes after optimization. Through optimal packing, twelve equations become 10 equations. Each equation (assignment statement) has a maximum of four inputs and one output. Each statement can be simply mapped on an ANR-C1 module 12. Accordingly, ten ANR-C1 modules 12 are used in an 8-bit encoder circuit.

The invention claimed is:

1. A system that generates configuration information that reconfigures a reconfigurable logic operation unit, wherein the reconfigurable logic operation unit includes:
   elements that are reconfigurable elements and each of the elements includes an integer k number of inputs; and
   reconfigurable data transfer channels that are channels for transferring data used in operations between a plurality of the elements, and
   the system comprises a memory and a processor, the memory storing a netlist generated based on a specification to be processed in the reconfigurable logic operation unit, an element structure library, and a set of modules to be executed with the processor, wherein the set of modules includes:
   an enumerating module that is configured to enumerate k-feasible cuts, where a number of nodes after cutting is no greater than the integer k, out of all cuts of respective nodes included in the netlist from a respective node using a top-down approach and a bottom-up approach to a predetermined largest k-value; and
   a generation module that is configured to generate, by referring to the element structure library, the configuration information that includes element reconfiguration information that reconfigures the elements by selecting cuts assigned to the elements out of the enumerated k-feasible cuts and channel reconfiguration information that reconfigures the data transfer channels so as to realize the netlist by connecting the reconfigured elements.

2. The system according to claim 1,
   wherein the generation module includes a unit that is configured to generate the configuration information that includes the element reconfiguration information and the channel reconfiguration information divided into units for reconfiguring the logic operation unit in a time division.

3. The system according to claim 1,
   wherein the enumerating module includes a unit that is configured to detect duplication in the enumerated k-feasibility cuts.

4. A method of generating configuration information for reconfiguring a reconfigurable logic operation unit using a computer including a CPU and a memory,
   wherein the reconfigurable logic operation unit includes:
   elements that are reconfigurable elements and each of the elements includes an integer k number of inputs; and
   reconfigurable data transfer channels that are channels for transferring data used in operations between a plurality of the elements, and
   wherein the memory stores a netlist generated based on a specification to be processed in the reconfigurable logic operation unit, an element structure library, and a set of modules to be executed with the CPU; and
   the method comprises the computer, with executing the set of modules:
   enumerating k-feasible cuts, where a number of nodes after cutting is no greater than the integer k, out of all cuts of respective nodes included in the netlist from a respective node using a top-down approach and a bottom-up approach to a predetermined largest k-value; and
   generating, by referring to the element structure library, the configuration information that includes element reconfiguration information that reconfigures the elements by selecting cuts assigned to the elements out of the enumerated k-feasible cuts and channel reconfiguration information that reconfigures the data transfer channels so as to realize the netlist by connecting the reconfigured elements.

5. The method according to claim 4,
   wherein the generating includes generating the configuration information that includes the element reconfiguration information and the channel reconfiguration information divided into units for reconfiguring the logic operation unit in a time division.

6. The method according to claim 4,
   further comprising detecting duplication in the enumerated k-feasibility cuts.

7. A non-transitory computer-readable medium encoded with a program, that generates configuration information for reconfiguring a reconfigurable logic operation unit using a computer including a CPU and a memory,
   wherein the reconfigurable logic operation unit includes:
   elements that are reconfigurable elements and each of the elements includes an integer k number of inputs; and
   reconfigurable data transfer channels that are channels for transferring data used in operations between a plurality of the elements, and
   wherein the memory stores a netlist generated based on a specification to be processed in the reconfigurable logic operation unit, an element structure library, and a set of modules to be executed with the CPU; and
   the program comprises instructions that are included in the set of modules causing the computer to execute:
   enumerating k-feasible cuts, where a number of nodes after cutting is no greater than the integer k, out of all cuts of respective nodes included in the netlist from a respective node using a top-down approach and a bottom-up approach to a predetermined largest k-value; and
   generating, by referring to the element structure library, the configuration information including element reconfiguration information that reconfigures the elements by selecting cuts assigned to the elements out of the enumerated k-feasible cuts and channel reconfiguration information that reconfigures the data transfer channels so as to realize the netlist by connecting the reconfigured elements.

* * * * *